(12) United States Patent
Du et al.

(10) Patent No.: US 12,029,086 B2
(45) Date of Patent: Jul. 2, 2024

(54) DISPLAY SUBSTRATE, MANUFACTURING METHOD THEREOF, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Lili Du, Beijing (CN); Hongjun Zhou, Beijing (CN); Cong Liu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 479 days.

(21) Appl. No.: 17/420,050

(22) PCT Filed: Sep. 29, 2020

(86) PCT No.: PCT/CN2020/118879
§ 371 (c)(1),
(2) Date: Jun. 30, 2021

(87) PCT Pub. No.: WO2022/067520
PCT Pub. Date: Apr. 7, 2022

(65) Prior Publication Data
US 2022/0320234 A1 Oct. 6, 2022

(51) Int. Cl.
*H10K 59/131* (2023.01)
*H10K 50/842* (2023.01)
(Continued)

(52) U.S. Cl.
CPC ....... *H10K 59/131* (2023.02); *H10K 50/8426* (2023.02); *H10K 71/00* (2023.02); *H10K 59/1201* (2023.02); *H10K 59/88* (2023.02)

(58) Field of Classification Search
CPC .. H10K 59/131; H10K 50/8426; H10K 71/00; H10K 59/1201; H10K 59/88; G02F 1/1339; G09G 3/36
See application file for complete search history.

(56) References Cited

U.S. PATENT DOCUMENTS

2005/0128416 A1* 6/2005 Hashimoto ........... G02F 1/1339
349/149
2017/0301739 A1* 10/2017 Park ..................... H10K 59/873
(Continued)

FOREIGN PATENT DOCUMENTS

CN 1627170 A 6/2005
CN 104681577 A 6/2015
(Continued)

*Primary Examiner* — Julia Slutsker
(74) *Attorney, Agent, or Firm* — Brooks Kushman P.C.

(57) ABSTRACT

A display substrate, a manufacturing method and a display device. In the display substrate, a first power source line includes a transmission portion and a first inlet portion coupled to the transmission portion, the transmission portion is arranged between a display region and the first inlet portion and extends in a first direction, and at least a part of the first inlet portion extends in a second direction. A second power source line includes a peripheral portion and two second inlet portions, the peripheral portion surrounds the display region and is provided with an opening, and two ends of the peripheral portion at the opening are coupled to the two second inlet portions respectively. The first inlet portion is arranged between the two second inlet portions, a first spacing region and a second spacing region are arranged between each second inlet portion and the first inlet portion, the first spacing region has a first distance in the first direction, the second spacing region has a second distance in the first direction, the first spacing region overlaps the encapsulation adhesive region at a first overlapping region, the second spacing region does not overlap the encapsula- (Continued)

tion adhesive region, and the first distance is greater than the second distance.

19 Claims, 15 Drawing Sheets

(51) Int. Cl.
*H10K 59/12* (2023.01)
*H10K 59/88* (2023.01)
*H10K 71/00* (2023.01)

(56) References Cited

U.S. PATENT DOCUMENTS

| 2017/0317299 | A1 | 11/2017 | Choi et al. |
| 2018/0226483 | A1 | 12/2018 | Kim et al. |
| 2020/0209177 | A1* | 7/2020 | Kim .................... H10K 59/131 |

FOREIGN PATENT DOCUMENTS

| CN | 105448956 A | 3/2016 |
| CN | 106252379 A | 12/2016 |
| CN | 107302060 A | 10/2017 |
| CN | 107565046 A | 1/2018 |
| CN | 107833979 A | 3/2018 |
| CN | 110018595 A | 7/2019 |
| CN | 111384296 A | 7/2020 |
| CN | 111430572 A | 7/2020 |
| JP | 2013080041 A | 5/2013 |

\* cited by examiner

DISPLAY SUBSTRATE, MANUFACTURING METHOD THEREOF, AND DISPLAY DEVICE

CROSS-REFERENCE TO RELATED APPLICATION

This application is the U.S. national phase of PCT Application No. PCT/CN2020/118879 filed on Sep. 29, 2020, which is incorporated herein by reference in its entirety.

TECHNICAL FIELD

The present disclosure relates to the field of display technology, in particular to a display substrate, a manufacturing method thereof, and a display device having the same.

BACKGROUND

In an Organic Light-Emitting Diode (OLED) display device, a metal layer and an organic layer are very sensitive to moisture and oxygen. When the moisture and oxygen enters the display device, the metal layer and the organic layer are oxidized, leading to shrinkage of a light-emitting region and the occurrence of a non-light-emitting part. In addition, the non-light-emitting part caused by the moisture and oxygen expands with the elapse of time, and the aging of elements accelerates, thereby a service life of the display device is shortened remarkably. Currently, in order to protect an interior of the display device from corrosion due to the moisture and oxygen in a better manner, usually the display device is encapsulated in various ways, e.g., using a sealant (e.g., frit glue) and an encapsulation cover plate.

SUMMARY

An object of the present disclosure is to provide a display substrate, a manufacturing method thereof, and a display device having the same, so as to solve the above problem.

In one aspect, the present disclosure provides in some embodiments a display substrate, including a display region and a non-display region surrounding the display region. The non-display region includes an encapsulation adhesive region, and a first power source line and a second power source line are arranged at the non-display region. The first power source line includes a transmission portion and a first inlet portion coupled to the transmission portion, the transmission portion is arranged between the display region and the first inlet portion and extends in a first direction, and at least a part of the first inlet portion extends in a second direction orthogonal to the first direction. The second power source line includes a peripheral portion and two second inlet portions, the peripheral portion surrounds the display region and is provided with an opening, and two ends of the peripheral portion at the opening are coupled to the two second inlet portions respectively. The first inlet portion is arranged between the two second inlet portions, a first spacing region and a second spacing region are arranged between each second inlet portion and the first inlet portion, the first spacing region has a first distance in the first direction, the second spacing region has a second distance in the first direction, the first spacing region overlaps the encapsulation adhesive region at a first overlapping region, the second spacing region does not overlap the encapsulation adhesive region, and the first distance is greater than the second distance.

In some possible embodiments of the present disclosure, the non-display region further includes a fanout region, a plurality of fanout lines is arranged at the fanout region, and the first overlapping region at least partially overlaps the fanout region.

In some possible embodiments of the present disclosure, an orthogonal projection of the first overlapping region onto a base substrate of the display substrate is located within an orthogonal projection of the fanout region onto the base substrate.

In some possible embodiments of the present disclosure, the plurality of fanout lines includes a plurality of target fanout lines, a first portion of each target fanout line is located at the encapsulation adhesive region, an orthogonal projection of the first portion onto the base substrate overlaps an orthogonal projection of the first power source line onto the base substrate and/or an orthogonal projection of the second power source line onto the base substrate, and a distance between orthogonal projections of the first portions of two adjacent target fanout lines onto the base substrate is greater than 1 μm.

In some possible embodiments of the present disclosure, the plurality of fanout lines includes a plurality of target fanout lines, a first portion of each target fanout line is located at the encapsulation adhesive region, an orthogonal projection of the first portion onto the base substrate overlaps an orthogonal projection of the first power source line onto the base substrate and/or an orthogonal projection of the second power source line onto the base substrate, and a distance a between orthogonal projections of the first portions of two adjacent target fanout lines onto the base substrate satisfies $a=(0.264\sim0.5)*k$, where k represents a line width of the target fanout line.

In some possible embodiments of the present disclosure, each second inlet portion includes a first inlet sub-pattern, a second inlet sub-pattern and a third inlet sub-pattern electrically coupled to each other in turn, the first inlet sub-pattern is electrically coupled to a corresponding end of the peripheral portion, the first spacing region is arranged between the first inlet sub-pattern and the first inlet portion, the second spacing region is arranged between the second inlet sub-pattern and the first inlet portion, and the second distance gradually increases in a direction close to the first spacing region until the second distance is equal to the first distance.

In some possible embodiments of the present disclosure, the third inlet sub-pattern extends in the second direction, and a third distance between the third inlet sub-pattern and the first inlet portion in the first direction is equal to a minimum value of the second distance.

In some possible embodiments of the present disclosure, a third spacing region is arranged between the third inlet sub-pattern and the first inlet portion, the display substrate further includes a gate driving circuitry and a plurality of first signal lines configured to provide signals to the gate driving circuitry, and at least a part of each first signal line is arranged at the second spacing region and/or the third spacing region.

In some possible embodiments of the present disclosure, the display substrate further includes a plurality of dummy signal lines, and at least a part of each dummy signal line is arranged at the first overlapping region.

In some possible embodiments of the present disclosure, the display substrate further includes a first gate metal layer, and each dummy signal line is arranged at a same layer, and made of a same material, as the first gate metal layer.

In some possible embodiments of the present disclosure, the display substrate further includes a second gate metal layer, and each dummy signal line is arranged at a same layer, and made of a same material, as the second gate metal layer.

In some possible embodiments of the present disclosure, the display substrate further includes a first gate metal layer and a second gate metal layer, the plurality of dummy signal lines includes a plurality of first dummy signal lines and a plurality of second dummy signal lines, orthogonal projections of the first dummy signal lines onto a base substrate of the display substrate and orthogonal projections of the second dummy signal lines onto the base substrate are arranged alternately, each first dummy signal line is arranged at a same layer, and made of a same material, as the first gate metal layer, and each second dummy signal line is arranged at a same layer, and made of a same material, as the second gate metal layer.

In some possible embodiments of the present disclosure, each dummy signal line extends in the first direction or the second direction.

In some possible embodiments of the present disclosure, the first overlapping region is covered by the dummy signal lines.

In some possible embodiments of the present disclosure, the display substrate further includes an encapsulation basal layer arranged at the encapsulation adhesive region, surrounding the display region, and broken at a side of the display region adjacent to the first inlet portion.

In some possible embodiments of the present disclosure, the display substrate further includes a first gate metal layer, and the encapsulation basal layer is arranged at a same layer, and made of a same material, as the first gate metal layer.

In some possible embodiments of the present disclosure, the display substrate further includes a base substrate, and a first gate insulation layer, a second gate insulation layer and an interlayer insulation layer laminated one on another on the base substrate in a direction away from the base substrate, the encapsulation basal layer is arranged between the first gate insulation layer and the second gate insulation layer, a plurality of first via-holes is formed in the encapsulation basal layer, the display substrate is further provided with a plurality of groups of first secondary via-holes corresponding to the plurality of first via-holes respectively, each group of first secondary via-holes include a plurality of first secondary via-holes, orthogonal projections of the plurality of first secondary via-holes onto the base substrate are located within an orthogonal projection of a corresponding first via-hole onto the base substrate, and each first secondary via-hole penetrates through the interlayer insulation layer, the second gate insulation layer and the first gate insulation layer.

In another aspect, the present disclosure provides in some embodiments a display device including the above-mentioned display substrate.

In some possible embodiments of the present disclosure, the display device further includes an encapsulation cover plate arranged opposite to the display substrate, and the encapsulation cover plate and the display substrate are sealed through a sealant at an encapsulation adhesive region.

In yet another aspect, the present disclosure provides in some embodiments a method for manufacturing a display substrate. The display substrate includes a display region and a non-display region surrounding the display region, and the non-display region includes an encapsulation adhesive region. The method includes forming a first power source line and a second power source line at the non-display region. The first power source line includes a transmission portion and a first inlet portion coupled to the transmission portion, the transmission portion is arranged between the display region and the first inlet portion and extends in a first direction, and at least a part of the first inlet portion extends in a second direction orthogonal to the first direction. The second power source line includes a peripheral portion and two second inlet portions, the peripheral portion surrounds the display region and is provided with an opening, and two ends of the peripheral portion at the opening are coupled to the two second inlet portions respectively. The first inlet portion is arranged between the two second inlet portions, a first spacing region and a second spacing region are arranged between each second inlet portion and the first inlet portion, the first spacing region has a first distance in the first direction, the second spacing region has a second distance in the first direction, the first spacing region overlaps the encapsulation adhesive region at a first overlapping region, the second spacing region does not overlap the encapsulation adhesive region, and the first distance is greater than the second distance.

BRIEF DESCRIPTION OF THE DRAWINGS

The following drawings are provided to facilitate the understanding of the present disclosure, and constitute a portion of the description. These drawings and the following embodiments are for illustrative purposes only, but shall not be construed as limiting the present disclosure. In these drawings.

DETAILED DESCRIPTION

In order to make the objects, the technical solutions and the advantages of the present disclosure more apparent, the present disclosure will be described hereinafter in a clear and complete manner in conjunction with the drawings and embodiments.

When encapsulating a display device through frit glue and an encapsulation cover plate, a fit glue layer surrounding the display device is formed at a peripheral region of the display device, then the encapsulation is placed over the display device, and then the fit glue is cured through a laser sintering process, so as to encapsulate functional structures of the display device between a base substrate of the display device and the encapsulation cover plate. However, due to the laser sintering process, the frit glue may shrink, and when it shrinks seriously, an encapsulation effect of an OLED display device may be adversely affected. At this time, it is impossible for the fit glue to effectively prevent the display device from corrosion caused by moisture and oxygen.

Figure 1:
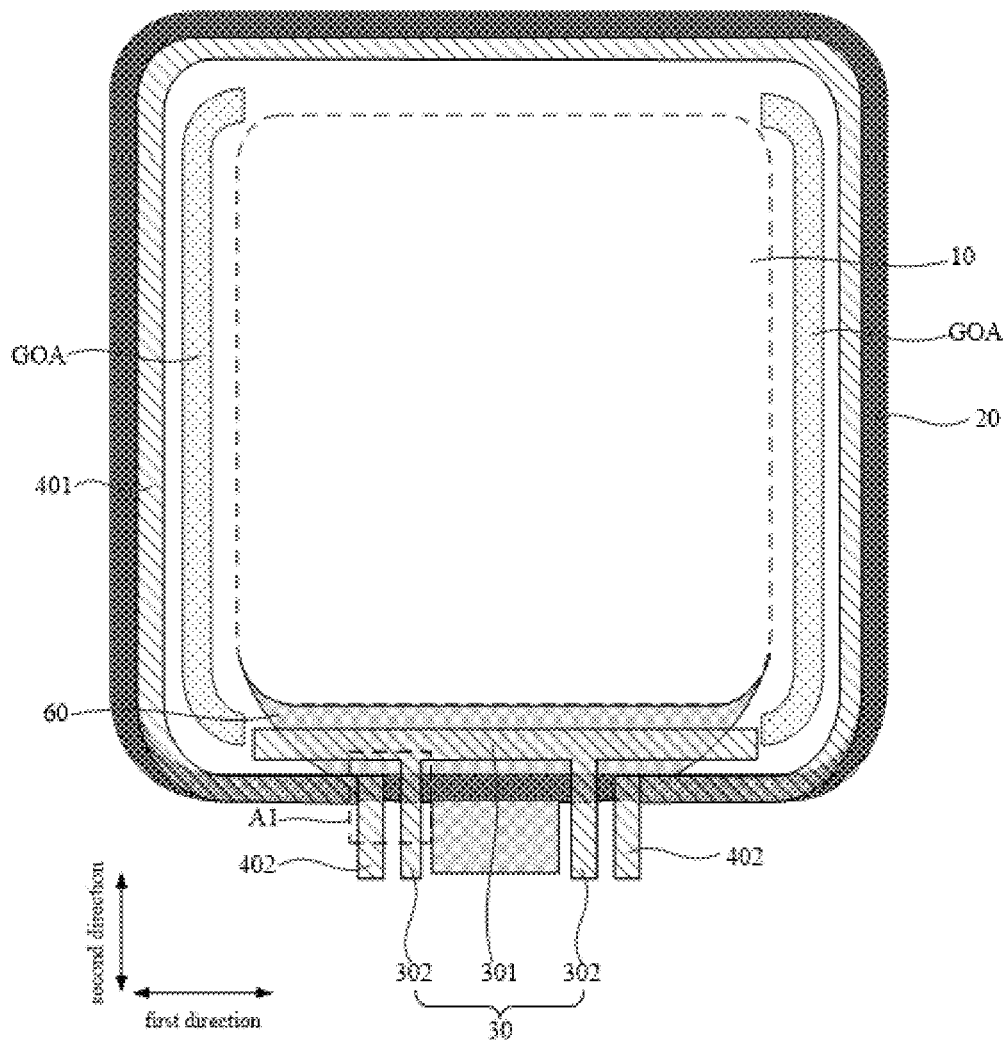
FIG. 1 is a schematic view showing a display substrate according to one embodiment of the present disclosure.
Figure 2:
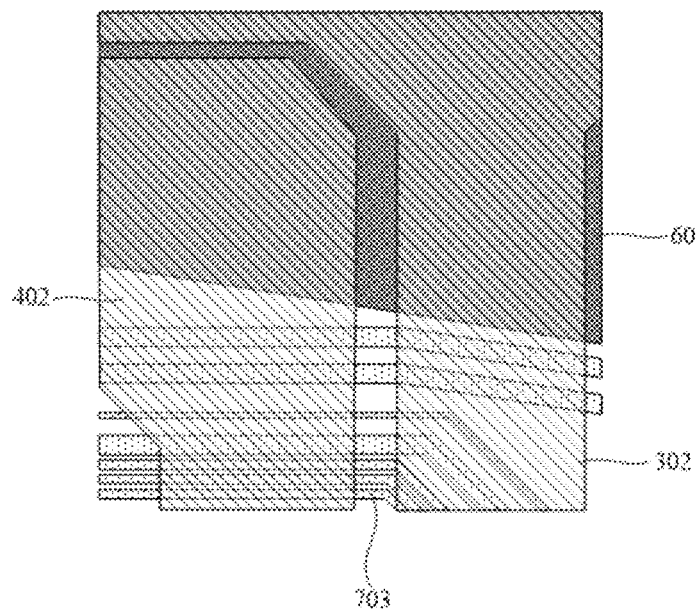
FIG. 2 is an enlarged view of A1 in FIG. 1.
Figure 6:
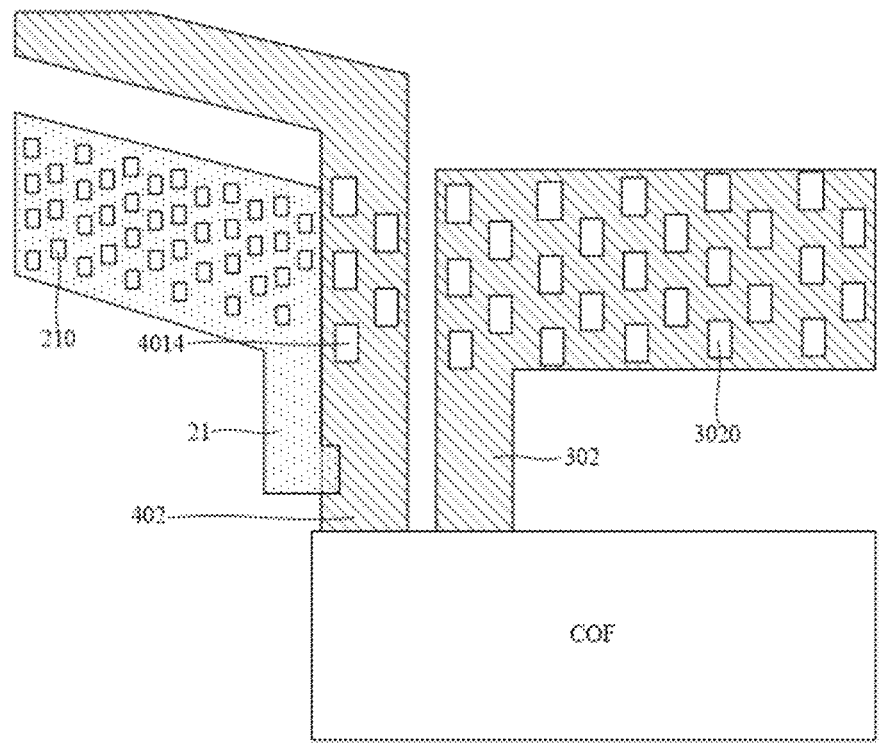
FIG. 6 is an enlarged view of A2 in FIG. 5.
Figure 17:
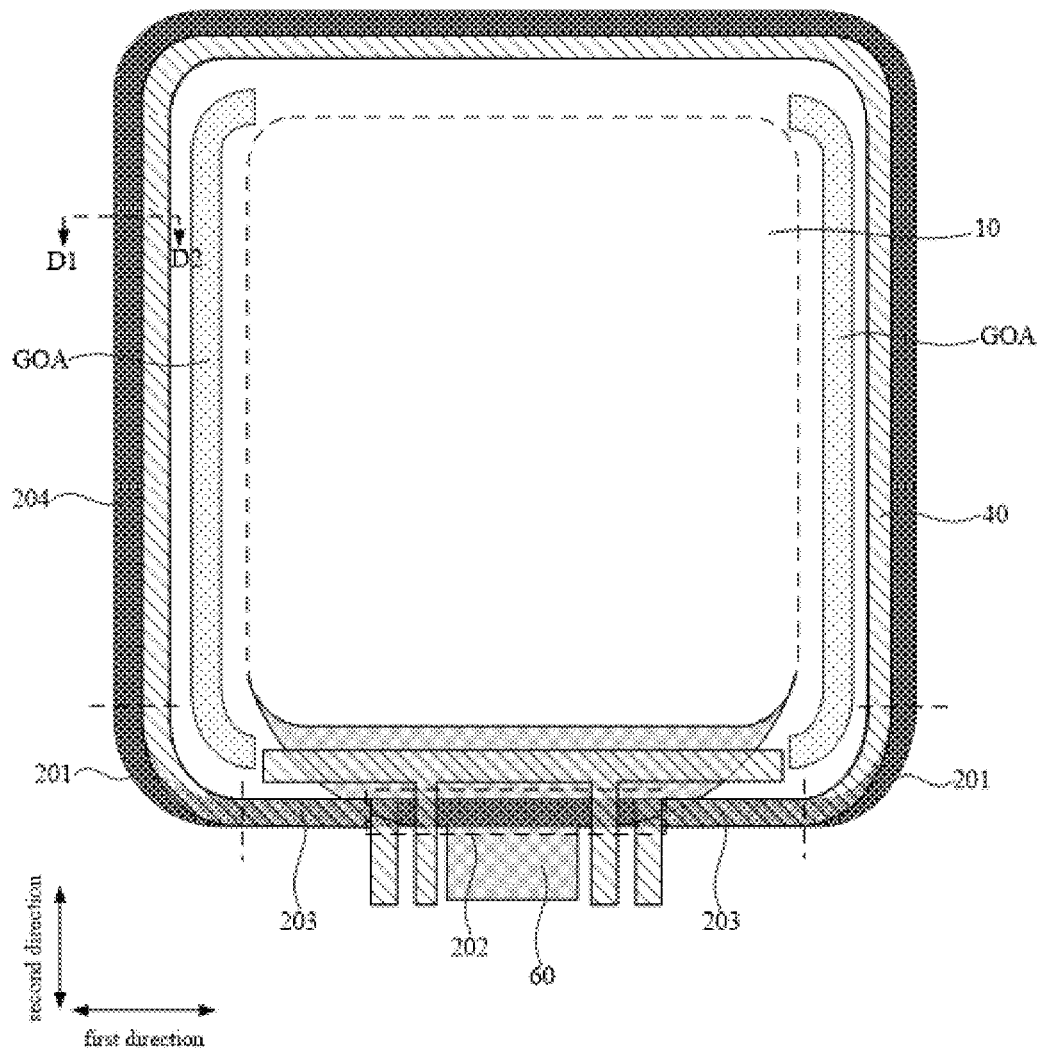
FIG. 17 is yet another schematic view showing the display substrate according to one embodiment of the present disclosure.

As shown in FIGS. 1 and 17, in a display substrate according to the embodiments of the present disclosure, a first power source line 30 (e.g., a positive power source line VDD) and a second power source line 40 (e.g., a negative power source line VSS) lead from a pin of a Chip On Film (COF) or an Integrated Circuit (IC) at a side where the COF or IC is arranged, so as to form an inlet region. Due to the limitation of a size of the COF or IC, a distance between VDD and VSS is relatively small, e.g., usually about 50 μm to 100 μm, in the vicinity of the inlet region of the display substrate (e.g., as shown in FIGS. 2 and 6, a second inlet portion 402 is close to a first inlet portion 302), and there is no wiring between VDD and VSS, so a surface of each of VDD and VSS away from a base substrate of the display substrate is flat in the vicinity of the inlet region.

In order to save a space of a lower frame of the display substrate (i.e., a frame where the inlet region is located), usually VSS and VDD at the lower frame serve as a fit encapsulation substrate. When the distance between VDD and VSS is relatively small in the vicinity of the inlet region and the surface of each of VDD and VSS away from the base substrate of the display substrate in the vicinity of the inlet region is flat, frit glue between VDD and VSS in the vicinity of the inlet region is adhered to the display substrate at a relatively small effective adhesion width. Hence, when the frit glue is irradiated with laser, the frit glue between VDD and VSS in the vicinity of the inlet region may shrink seriously. At this time, moisture and oxygen may easily enter a display device at this position, so there is a risk of electrochemical corrosion for the display device.

As shown in FIGS. 1, 3, 4, 7, 8 and 17, the present disclosure provides in some embodiments a display substrate, which includes a display region 10 and a non-display region surrounding the display region 10. The non-display region includes an encapsulation adhesive region 20, and a first power source line 30 and a second power source line 40 are arranged at the non-display region.

The first power source line 30 includes a transmission portion 301 and a first inlet portion 302 coupled to the transmission portion 301, the transmission portion 301 is arranged between the display region and the first inlet portion 302 and extends in a first direction, and at least a part of the first inlet portion 302 extends in a second direction orthogonal to the first direction.

The second power source line 40 includes a peripheral portion 401 and two second inlet portions 402, the peripheral portion 401 surrounds the display region and is provided with an opening, and two ends of the peripheral portion 401 at the opening are coupled to the two second inlet portions 402 respectively.

The first inlet portion 302 is arranged between the two second inlet portions 402, a first spacing region 51 and a second spacing region 52 are arranged between each second inlet portion 402 and the first inlet portion 302, the first spacing region 51 has a first distance d in the first direction, the second spacing region 52 has a second distance b in the first direction, the first spacing region 51 overlaps the encapsulation adhesive region 20 at a first overlapping region, the second spacing region 52 does not overlap the encapsulation adhesive region 20, and the first distance d is greater than the second distance b.

To be specific, the display substrate may include the display region and the non-display region. For example, the display region may be of a circular or rectangular shape, and the non-display region may completely surround the display region.

The display substrate may include the first power source line 30 and the second power source line 40. For example, the first power source line 30 may be a positive power source signal line VDD, and the second power source line 40 may be a negative power source signal line VSS.

The first power source line 30 may include the transmission portion 301 and the first inlet portion 302 electrically coupled to each other. For example, the transmission portion 301 may be arranged between the display region and the first inlet portion 302 and extend in the first direction, and at least a part of the first inlet portion 302 may extend in the second direction. For example, the first direction may be a horizontal direction, and the second direction may be a longitudinal direction.

Figure 5:
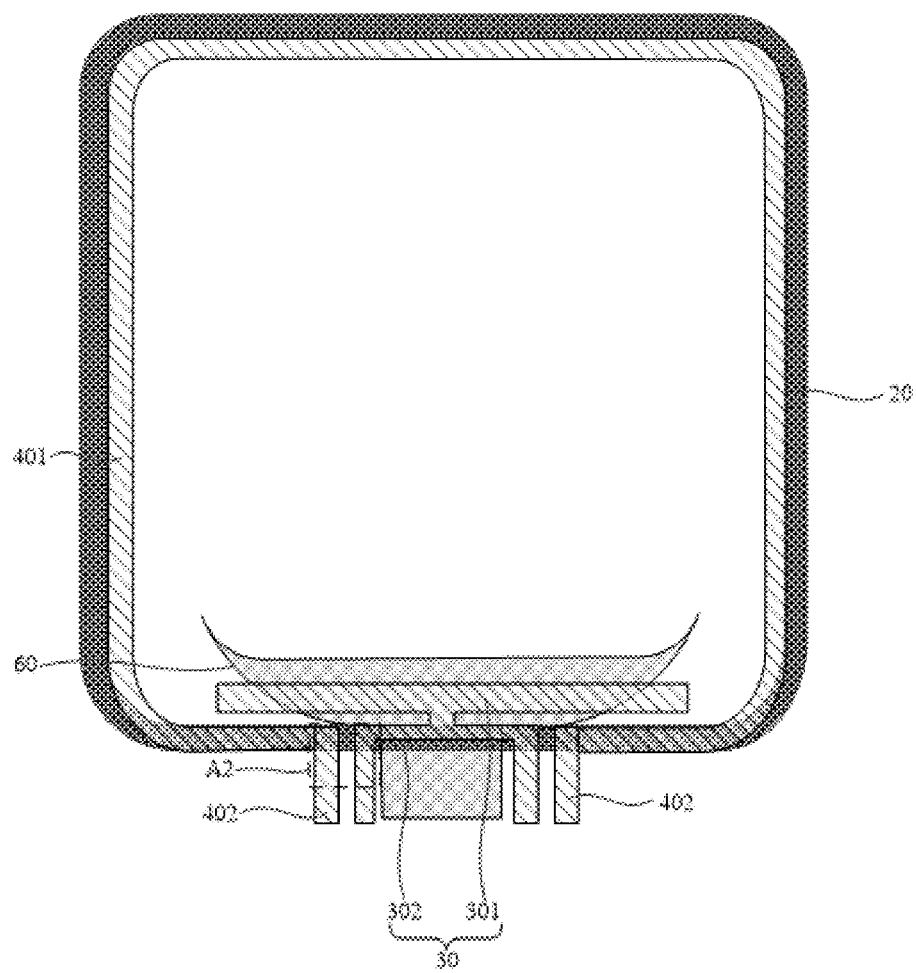
FIG. 5 is another schematic view showing the display substrate according to one embodiment of the present disclosure.

It should be appreciated that, a shape of the first inlet portion 302 and the quantity thereof will not be particularly defined herein. For example, as shown in FIG. 1, the first power source line 30 may include two first inlet portions 302 each extending in the second direction and electrically coupled to the transmission portion 301. The two first inlet portions 302 may be spaced apart from each other in the first direction, and arranged between the two second inlet portions 402. For example, as shown in FIG. 5, the first power source line 30 may include one first inlet portion 302 of a door-like structure, and one side of the first inlet portion 302 close to the transmission portion 301 may be electrically coupled to the transmission portion 301.

It should be appreciated that, the display substrate may further include a power source pattern arranged at the display region. For example, at least a part of the power source pattern may extend in the second direction, and the power source pattern may be electrically coupled to the transmission portion 301. For example, the first inlet portion 302 may be electrically coupled to a pin of a binding flexible circuit board in the display substrate. The power source pattern is configured to receive a first power source signal transmitted via the first inlet portion 302 and the transmission portion 301.

As shown in FIG. 1, the second power source line 40 may include the peripheral portion 401 and two second inlet portions 402. The peripheral portion 401 may surround the display region, and electrically coupled to a cathode in the display substrate. At least a part of each second inlet portion 402 may extend in the second direction. For example, each second inlet portion 402 may be electrically coupled to the pin of the binding flexible circuit board in the display substrate.

Taking the display substrate of a quadrilateral shape as an example, the display region may be of a quadrilateral shape, a first side of the display region may defined as a side close to a binding chip, a second side of the display region may be defined as a side opposite to the first side, a third side and a fourth side of the display region may be arranged opposite to each other, the third side may be arranged at a left side of the display region, and the fourth side may be arranged at a right side of the display region.

The peripheral portion 401 may enclose the second side, the third side, the fourth side and a part of the first side of the display region. The opening may be formed in the peripheral portion 401 at the first side, the peripheral portion 401 may be provided with two ends at the opening, and the two ends may be coupled to the two second inlet portions 402 respectively.

The transmission portion 301 may be arranged at the first side of the display substrate and between the display region 10 and the peripheral portion 401, and the first inlet portion 302 may be arranged between the two second inlet portions 402. When the first power source line 30 includes one first inlet portion 302, the first spacing region 51 and the second spacing region 52 may be formed between each second inlet portion 402 and the first inlet portion 302. When the first power source line 30 includes two first inlet portions 302, the first spacing region 51 and the second spacing region 52 may be formed between each second inlet portion 402 and an adjacent first inlet portion 302.

Figure 3:
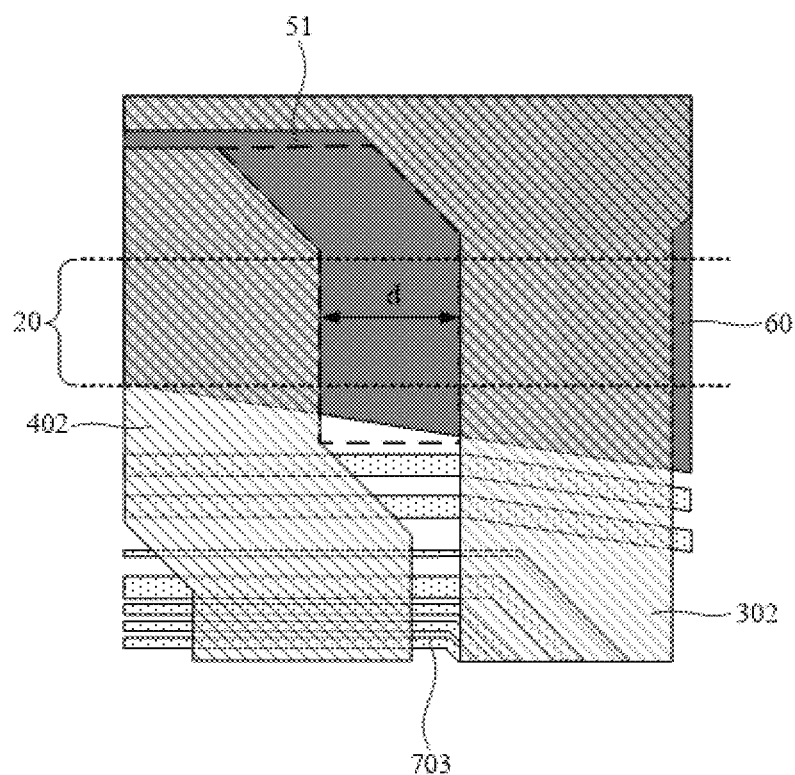
FIG. 3 is another enlarged view of A1 in FIG. 1.
Figure 4:
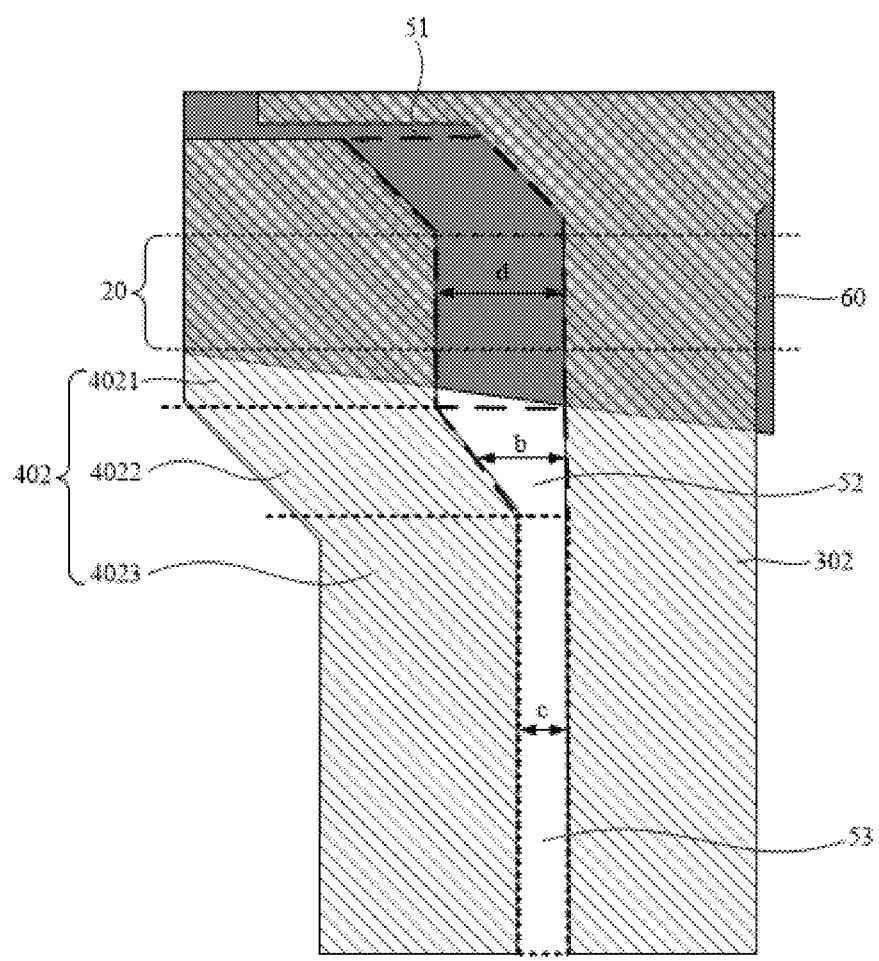
FIG. 4 is a schematic view showing a spacing region between a first inlet portion and a second inlet portion according to one embodiment of the present disclosure.

As shown in FIGS. 1, 3 and 4, the non-display region may further include the encapsulation adhesive region 20 surrounding the display region, and the fit glue may be formed at the encapsulation adhesive region 20. The first spacing region 51 may overlap the encapsulation adhesive region 20 at the first overlapping region, and the second spacing region 52 may not overlap the encapsulation adhesive region 20. At any position in the first spacing region 51, the first spacing region 51 may have the first distance d in the first direction. For example, the first distance d may be a minimum distance of the first spacing region 51 in the first direction. The second spacing region 52 may have the second distance b in the first direction. For example, the second distance b may be an average distance of the second spacing region 52 in the first direction. For example, the second distance b may be equal to 300 μm, and the first distance d may be greater than the second distance b.

Based on the above-mentioned structure of the display substrate, according to the embodiments of the present disclosure, the first spacing region 51 and the second spacing region 52 may be arranged between the second inlet portion 402 and the first inlet portion 302, the first spacing region 51 may have the first distance d in the first direction, the second spacing region 52 may have the second distance b in the first direction, the first spacing region 51 may overlap the encapsulation adhesive region 20 at the first overlapping region, the second spacing region 52 may not overlap the encapsulation adhesive region 20, and the first distance d may be greater than the second distance b. In this way, it is able to increase a distance between the second inlet portion 402 and the first inlet portion 302 at the first overlapping region in a better manner, and reduce flatness of a surface of the display substrate away from a base substrate at the first overlapping region, thereby to increase an adhesion area and an adhesion strength between the fit glue and the display substrate, ensure an effective adhesion width of the frit glue at the first overlapping region, improve an encapsulation effect, and prevent the occurrence of an encapsulation failure. Hence, according to the display substrate in the embodiments of the present disclosure, it is able to effective prevent the moisture and oxygen from entering the display device in the vicinity of the first overlapping region without any additional film layer or any improvement in an existing frit encapsulation process, thereby to reduce a risk of electrochemical corrosion for the display device.

As shown in FIGS. 1, 3, 15 and 16, in some embodiments of the present disclosure, the non-display region may further include a fanout region 60, a plurality of fanout lines 601 may be arranged at the fanout region 60, and the first overlapping region may at least partially overlap the fanout region 60.

To be specific, the plurality of fanout lines 601 may be arranged at the fanout region 60. For example, a plurality of data lines may be arranged at the display region, the plurality of fanout lines 601 may include a plurality of leading wires for the data lines, and the leading wires may be electrically coupled to the data lines respectively.

For example, the plurality of fanout lines may be arranged at a same layer and made of a same material.

For example, the plurality of fanout lines may include a plurality of first fanout lines 6011 and a plurality of second fanout lines 6012. The plurality of first fanout lines 6011 may be arranged at a same layer and made of a same material, the plurality of second fanout lines 6012 may be arranged at a same layer and made of a same material, and the plurality of first fanout lines 6011 may be arranged at a layer different from the plurality of second fanout lines 6012. Orthogonal projections of the plurality of first fanout lines 6011 onto the base substrate of the display substrate and orthogonal projections of the plurality of second fanout lines 6012 onto the base substrate may be arranged alternately.

As mentioned above, the first overlapping region may at least partially overlap the fanout region 60, so as to further reduce the flatness of the surface of the display substrate away from the base substrate at the first overlapping region, thereby to further increase the adhesion area and the adhesion strength between the fit glue and the display substrate. In this way, when the frit glue is irradiated by laser, it is able to effectively reduce a shrinkage level of the frit glue at the first overlapping region and ensure the effective adhesion width of the frit glue, thereby to improve the encapsulation effect and prevent the occurrence of the encapsulation failure.

In some embodiments of the present disclosure, an orthogonal projection of the first overlapping region onto the base substrate of the display substrate may be located within an orthogonal projection of the fanout region 60 onto the base substrate.

Based on the above arrangement mode, it is able to reduce the flatness of the surface of the display substrate away from the base substrate at the first overlapping region to the greatest extent, thereby to further increase the adhesion area and the adhesion strength between the frit glue and the display substrate. In this way, when the frit glue is irradiated by laser, it is able to effectively reduce the shrinkage level of the frit glue at the first overlapping region and ensure the effective adhesion width of the frit glue, thereby to improve the encapsulation effect and prevent the occurrence of the encapsulation failure.

Figure 15:
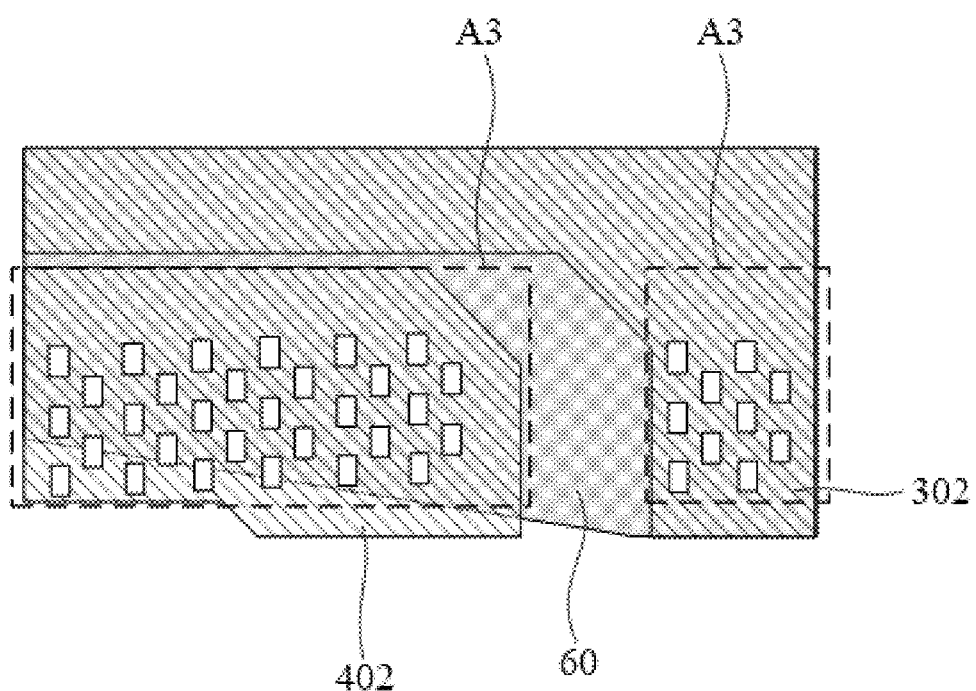
FIG. 15 is a schematic view showing a situation where a fanout region overlaps a first power source line and a second power source line.
Figure 16:
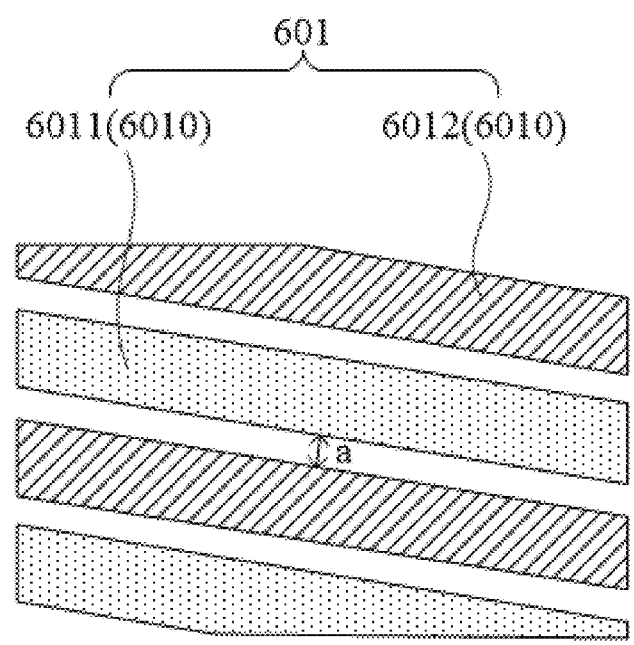
FIG. 16 is an enlarged view of a fanout line at region A3 in FIG. 15.

As shown in FIGS. 1, 15 and 16, in some embodiments of the present disclosure, the plurality of fanout lines 601 may include a plurality of target fanout lines, a first portion 6010 of each target fanout line may be located at the encapsulation adhesive region 20, an orthogonal projection of the first portion 6010 onto the base substrate may overlap an orthogonal projection of the first power source line 30 onto the base substrate and/or an orthogonal projection of the second power source line 40 onto the base substrate, and a distance a between orthogonal projections of the first portions 6010 of two adjacent target fanout lines onto the base substrate may be greater than 1 μm.

For example, the plurality of fanout lines 601 may be arranged at a same layer and made of a same material.

For example, the plurality of fanout lines 601 may include a plurality of first fanout lines 6011 and a plurality of second fanout lines 6012. The plurality of first fanout lines 6011 may be arranged at a same layer and made of a same material, the plurality of second fanout lines 6012 may be arranged at a same layer and made of a same material, and the plurality of first fanout lines 6011 may be arranged at a layer different from the plurality of second fanout lines 6012. Orthogonal projections of the plurality of first fanout lines 6011 onto the base substrate and orthogonal projections of the plurality of second fanout lines 6012 onto the base substrate may be arranged alternately.

For example, the distance a between the orthogonal projections of the first portions 6010 of the adjacent target fanout lines onto the base substrate may be 1.5 μm.

Figure 14:
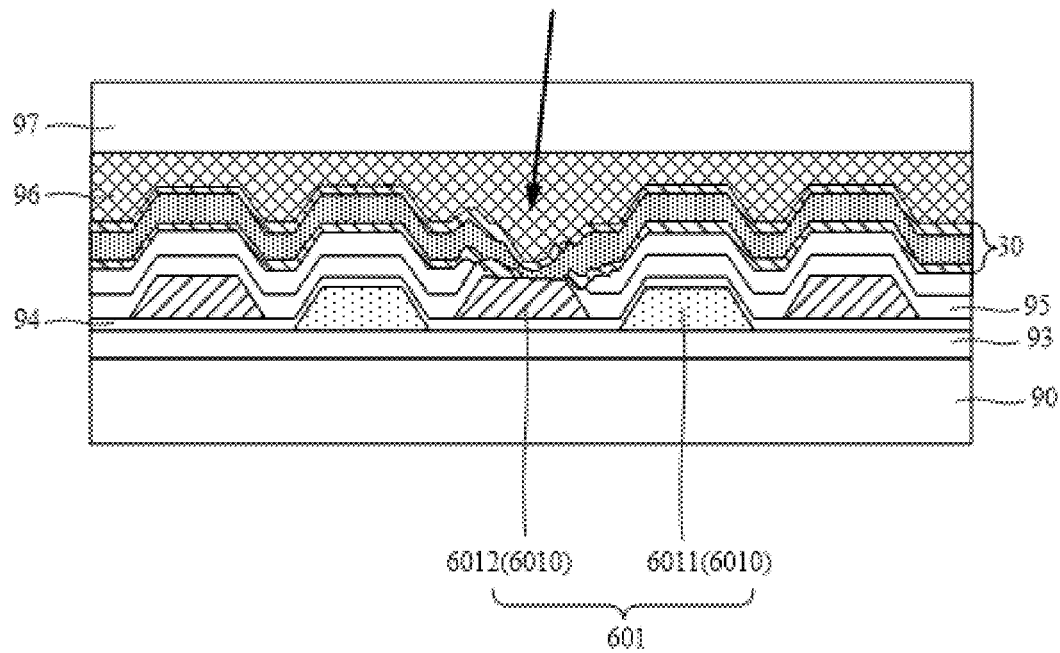
FIG. 14 is a schematic view showing a situation where short circuit occurs between VDD or VSS and a fanout line.

As shown in FIG. 14, when a rigid OLED display substrate is encapsulation using the frit glue and an encapsulation cover plate 97 is attached to the display substrate, the first power source line 30 and the second power source line 40 may easily be pressed into the fanout line 601 (a position as indicated by an arrow in FIG. 14) due to large granular foreign matters in the frit glue, so a short circuit may occur between each of the first power source line 30 and the second power source line 40 and the fanout line, and thereby an X-line defect may occur.

In the display device according to the embodiments of the present disclosure, the distance between the orthogonal projections of the first portions 6010 of the adjacent target fanout lines onto the base substrate 90 may be greater than 1 μm, so that a distance between the first portions 6010 of the adjacent target fanout lines may increase at the encapsulation adhesive region 20, and a density of the target fanout lines covered by the first power source line 30 and/or the second power source line 40 at the encapsulation adhesive region 20 may decrease. In this regard, when the encapsulation cover plate 97 is attached to the display substrate, it is able to reduce a probability of the short circuit between each of the first power source line 30 and the second power source line 40 and the fanout line due to the large granular foreign matters.

As shown in FIGS. 1, 15 and 16, in some embodiments of the present disclosure, the plurality of fanout lines 601 may include a plurality of target fanout lines, and a first portion 6010 of each target fanout line may be arranged at the encapsulation adhesive region 20. An orthogonal projection of the first portion 6010 onto the base substrate may overlap an orthogonal projection of the first power source line 30 onto the base substrate and/or an orthogonal projection of the second power source line 40 onto the base substrate, and a distance a between orthogonal projections of the first portions 6010 of two adjacent target fanout lines onto the base substrate may satisfy a=(0.264~0.5)*k, where k represents a line width of the target fanout line.

To be specific, a may be 0.264 to 0.5 times of k. For example, k may be 3.8 μm.

As shown in FIG. 4, in some embodiments of the present disclosure, each second inlet portion 402 may include a first inlet sub-pattern 4021, a second inlet sub-pattern 4022 and a third inlet sub-pattern 4023 electrically coupled to each other in turn, and the first inlet sub-pattern 4021 may be electrically coupled to a corresponding end of the peripheral portion 401. The first spacing region 51 may be arranged between the first inlet sub-pattern 4021 and the first inlet portion 302, the second spacing region 52 may be arranged between the second inlet sub-pattern 4022 and the first inlet portion 302, and the second distance b may gradually increase in a direction close to the first spacing region 51 until the second distance b is equal to the first distance d.

For example, the second distance b may be 30 μm to 290 μm, and the first distance d may be 150 μm to 600 μm.

For example, both the first inlet sub-pattern 4021 and the third inlet sub-pattern 4023 may extend in the second direction, and the second inlet sub-pattern 4022 may extend in a third direction.

For example, the first inlet sub-pattern 4021, the second inlet sub-pattern 4022, the third inlet sub-pattern 4023 and the peripheral portion 401 may be formed integrally.

The first inlet sub-pattern 4021 may be electrically coupled to a corresponding end of the peripheral portion 401, and the third inlet sub-pattern 4023 may be electrically coupled to a driving IC in the display substrate.

When the second distance b gradually increases in the direction close to the first spacing region 51 until it is equal to the first distance d, a distance between the second inlet portion 402 and the first inlet portion 302 may increase gradually in a direction close to the encapsulation adhesive region 20. In this regard, it is able to ensure the encapsulation performance as well as signal output stability of the second power source line 40.

As shown in FIG. 4, in some embodiments of the present disclosure, the third inlet sub-pattern 4023 may extend in the second direction, and a third distance c between the third inlet sub-pattern 4023 and the first inlet portion 302 in the first direction may be equal to a minimum value of the second distance b.

To be specific, the third inlet sub-pattern 4023 may extend in the second direction, the first inlet portion 302 may extend in the second direction, and the third inlet sub-pattern 4023 may be spaced apart from the first inlet portion 302 in the first direction by the third distance c. For example, the third distance may be 80 μm.

The third inlet sub-pattern 4023 and the first inlet portion 302 are both electrically coupled to the driving IC or the flexible circuit board in the display substrate, and the driving IC or the flexible circuit board is of a limited size. Hence, when the third distance c is equal to the minimum value of the second distance b, the distance between the third inlet sub-pattern 4023 and the first inlet portion 302 may be relatively small, so it is able to reduce a difficulty in the electrical coupling of each of the third inlet sub-pattern 4023 and the first inlet portion 302 to the driving IC or the flexible circuit board in the display substrate.

Figure 19:
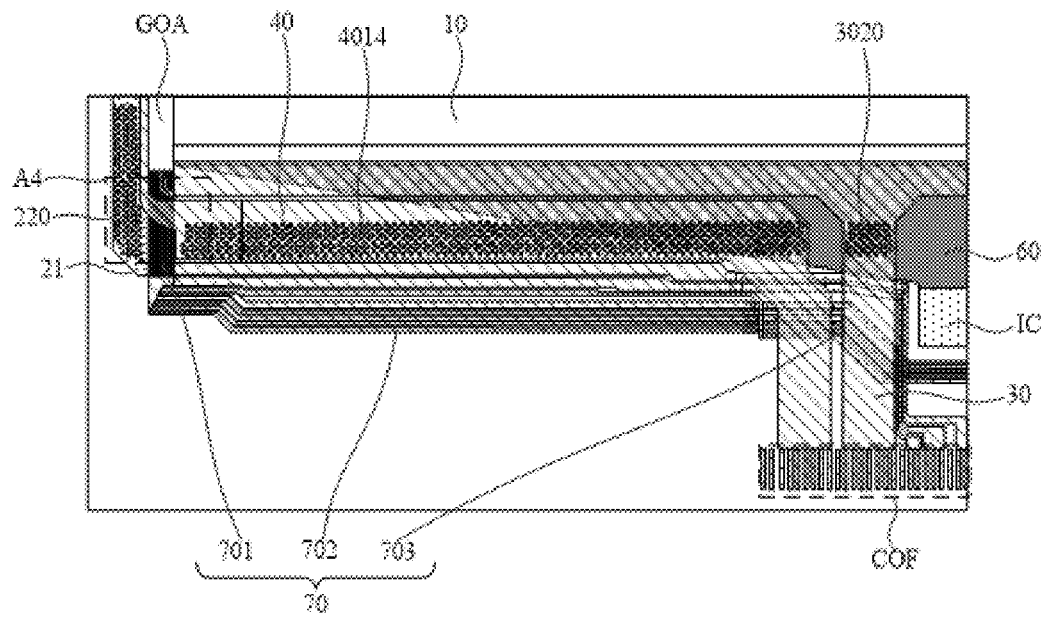
FIG. 19 is an enlarged view of a lower left portion of a frame in FIG. 17.

As shown in FIGS. 4 and 19, in some embodiments of the present disclosure, the second spacing region 52 may be arranged between the second inlet sub-pattern 4022 and the first inlet portion 302, and a third spacing region 53 may be arranged between the third inlet sub-pattern 4023 and the first inlet portion 302. The display substrate may further include a gate driving circuitry GOA and a plurality of first signal lines 70 configured to provide signals to the gate driving circuitry GOA, and at least a part of each first signal line 70 may be arranged at the second spacing region 52 and/or the third spacing region 53.

To be specific, the display substrate may further include the gate driving circuitry GOA. For example, the gate driving circuitry GOA may include shift register units corresponding to gate lines of the display substrate respectively, so as to provide a scanning signal to each gate line.

The display substrate may further include the plurality of first signal lines 70 configured to provide signals to the gate driving circuitry GOA. The plurality of first signal lines 70 may be of various types, e.g., the plurality of first signal lines 70 may include a frame start signal line, a clock signal line, a first level signal line, a second level signal line, etc.

The gate driving circuitry GOA may be arranged at a left side and a right side of the display region, and each first signal line 70 may be electrically coupled to the gate driving circuitry GOA and the driving IC in the display substrate.

Figure 9:
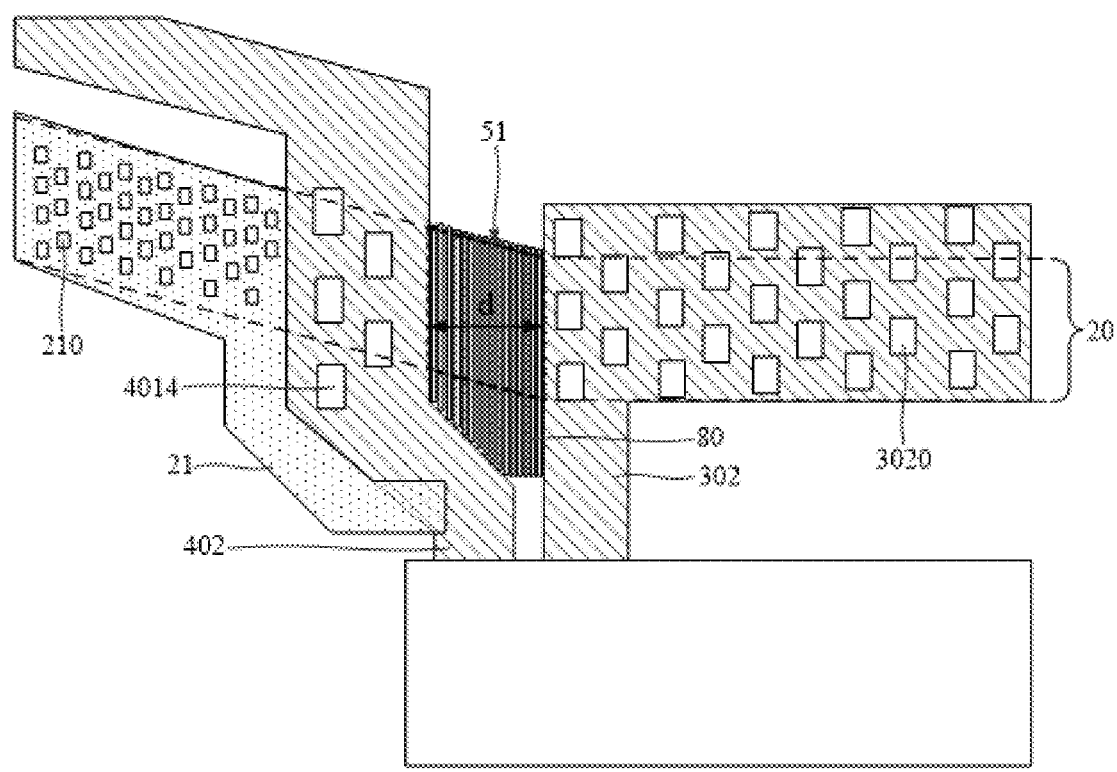
FIG. 9 is an enlarged view of A3 in FIG. 5.
Figure 10:
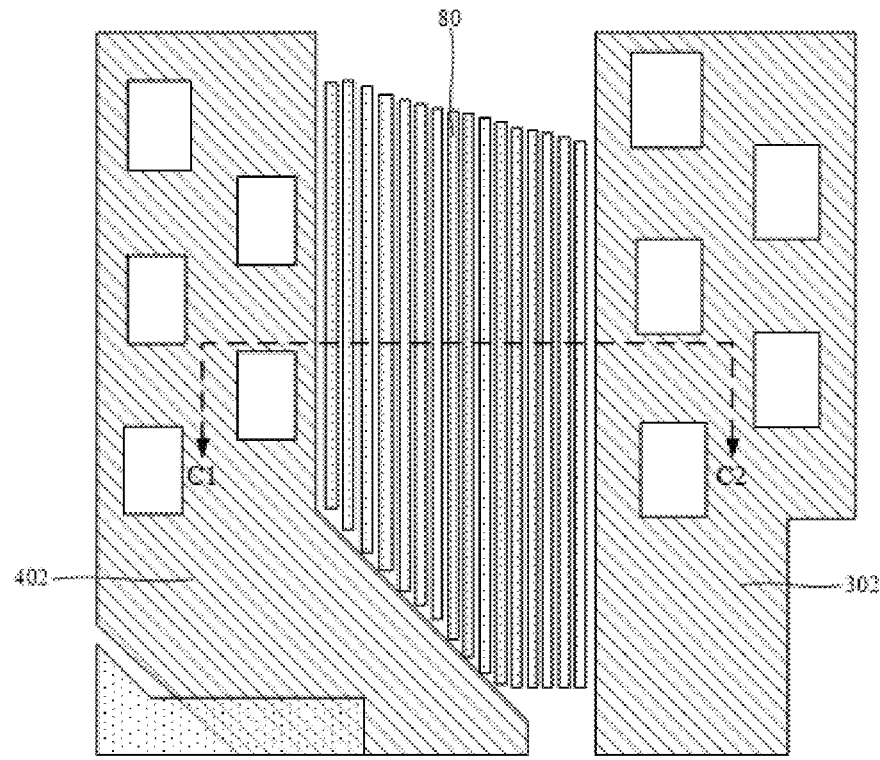
FIG. 10 is an enlarged view of a portion surrounding a first overlapping region in FIG. 9.

As shown in FIGS. 9 and 10, in some embodiments of the present disclosure, the display substrate may further include a plurality of dummy signal lines 80, and at least a part of each dummy signal line 80 may be arranged at the first overlapping region.

To be specific, the display substrate may further include the plurality of dummy signal lines 80 spaced apart from each other, and each dummy signal line 80 may be in a floating state. At least a part of each dummy signal line 80 may be arranged at the first overlapping region.

When at least a part of each dummy signal line is arranged at the first overlapping region, the surface of the display substrate away from the base substrate at the first overlapping region may be uneven, so it is able to further reduce the flatness of the surface of the display substrate away from the base substrate at the first overlapping region, and increase the adhesion area and the adhesion strength between the frit glue and the display substrate. In this way, when the frit glue is irradiated by laser, it is able to effectively reduce the shrinkage level of the frit glue at the first overlapping region and ensure the effective adhesion width of the frit glue, thereby to improve the encapsulation effect and prevent the occurrence of the encapsulation failure.

Figure 11:
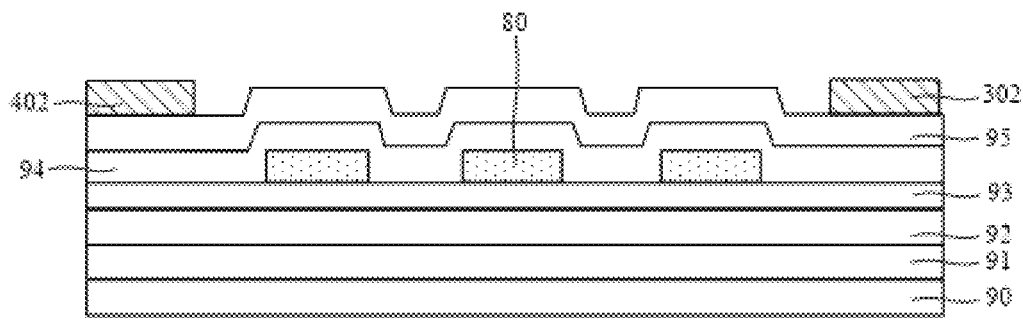
FIG. 11 is a sectional view of the portion along C1C2 in FIG. 10.

As shown in FIG. 11, in some embodiments of the present disclosure, the display substrate may further include a first gate metal layer, and each dummy signal line 80 may be arranged at a same layer, and made of a same material, as the first gate metal layer.

To be specific, the display substrate may include an active layer, a first gate insulation layer 93, a first gate metal layer, a second gate insulation layer 94, a second gate metal layer, an interlayer insulation layer 95 and a first source/drain metal layer laminated one on another in a direction away from the base substrate 90. The active layer may be used to form an active layer pattern of a thin film transistor in the display substrate and some conductive connection patterns. The first gate metal layer may be used to form a gate electrode of the thin film transistor and a gate line of the display substrate. The second gate metal layer may be used to form an electrode plate of a capacitor of the display substrate and an initialization signal line pattern. The first source/drain metal layer may be used to form the first power source line 30, the second power source line 40, a data line and some conductive connection members of the display substrate.

When each dummy signal line is arranged at a same layer, and made of a same material, as the first gate metal layer, it is able to form the dummy signal line and the first gate metal layer through a single patterning process, thereby to simplify the manufacture of the display substrate and reduce the manufacture cost.

Figure 12:
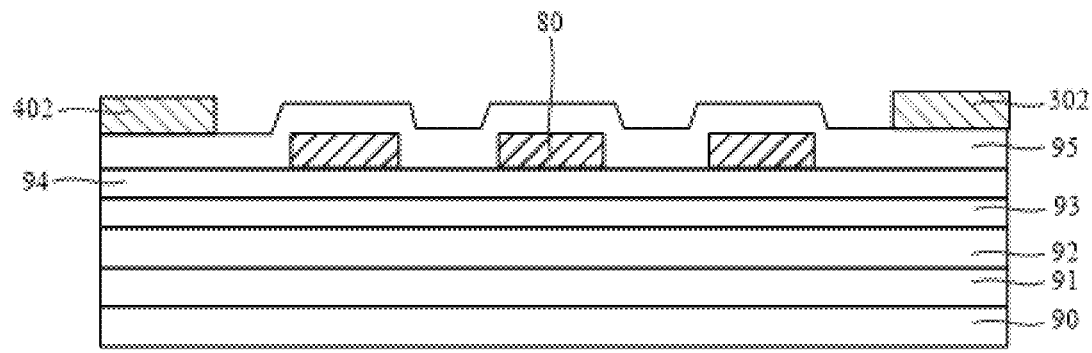
FIG. 12 is another sectional view of the portion along C1C2 in FIG. 10.

As shown in FIG. 12, in some embodiments of the present disclosure, the display substrate may further include a second gate metal layer, and each dummy signal line 80 may be arranged at a same layer, and made of a same material, as the second gate metal layer.

When each dummy signal line 80 is arranged at a same layer, and made of a same material, as the second gate metal layer, it is able to form the dummy signal line and the second gate metal layer through a single patterning process, thereby to simplify the manufacture of the display substrate and reduce the manufacture cost.

Figure 13:
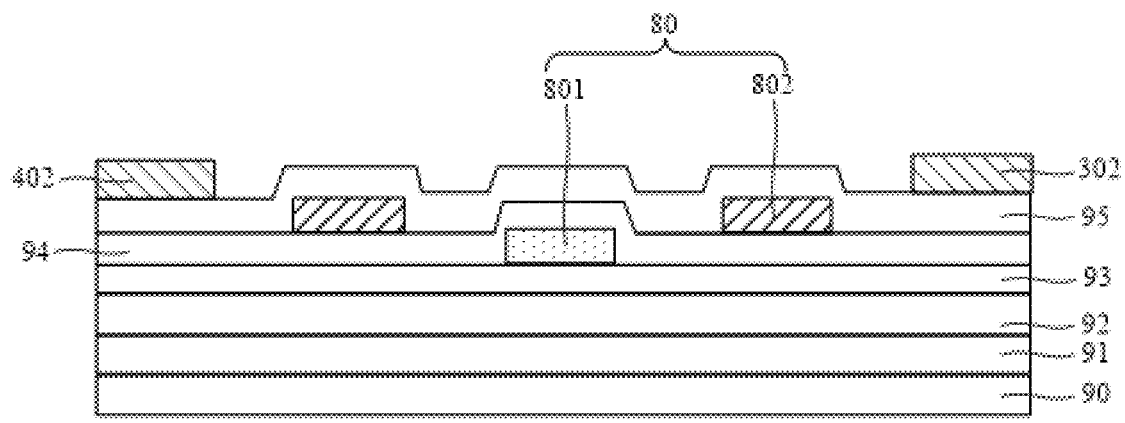
FIG. 13 is yet another sectional view of the portion along C1C2 in FIG. 10.

As shown in FIG. 13, in some embodiments of the present disclosure, the display substrate may further include a first gate metal layer and a second gate metal layer. The plurality of dummy signal lines may include a plurality of first dummy signal lines 801 and a plurality of second dummy signal lines 802, orthogonal projections of the first dummy signal lines 801 onto the base substrate 90 of the display substrate and orthogonal projections of the second dummy signal lines 802 onto the base substrate 90 may be arranged alternately, each first dummy signal line 801 may be arranged at a same layer, and made of a same material, as the first gate metal layer, and each second dummy signal line 802 may be arranged at a same layer, and made of a same material, as the second gate metal layer.

When the first dummy signal line 801 is arranged at a same layer, and made of a same material, as the first gate metal layer and the second dummy signal line 802 is arranged at a same layer, and made of a same material, as the second gate metal layer, it is able to form the first dummy signal line 801 and the first gate metal layer through a single patterning process and form the second dummy signal line 802 and the second gate metal layer through a single patterning process, thereby to simplify the manufacture of the display substrate and reduce the manufacture cost.

In some embodiments of the present disclosure, each dummy signal line 80 may extend in the first direction or the second direction.

To be specific, an extension direction of each dummy signal line may be set according to the practical need, e.g., the dummy signal line may extend in the first direction, the second direction or the third direction, and the third direction may be orthogonal to both the first direction and the second direction.

As shown in FIG. 9, in some embodiments of the present disclosure, the first overlapping region may be covered by the dummy signal lines 80.

When the first overlapping region is covered by the dummy signal lines 80, the surface of the display substrate away from the base substrate 90 at the entire first overlapping region may be uneven, so it is able to reduce the flatness of the surface of the display substrate away from the base substrate 90 at the first overlapping region in a better manner, and increase the adhesion area and the adhesion strength between the frit glue and the display substrate. In this way, when the fit glue is irradiated by laser, it is able to effectively reduce the shrinkage level of the frit glue at the first overlapping region and ensure the effective adhesion width of the fit glue, thereby to improve the encapsulation effect and prevent the occurrence of the encapsulation failure.

Figure 7:
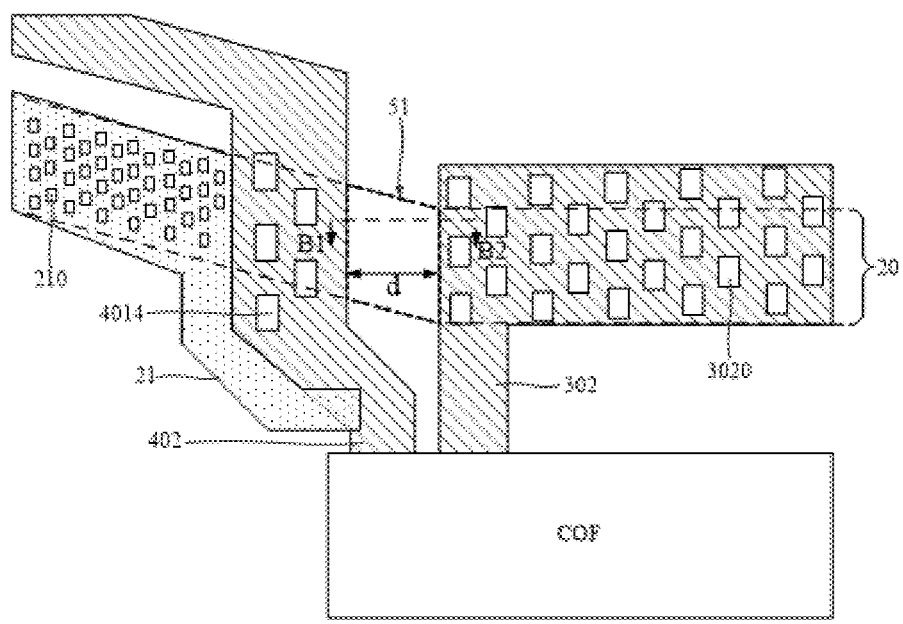
FIG. 7 is another enlarged view of A2 in FIG. 5.
Figure 8:
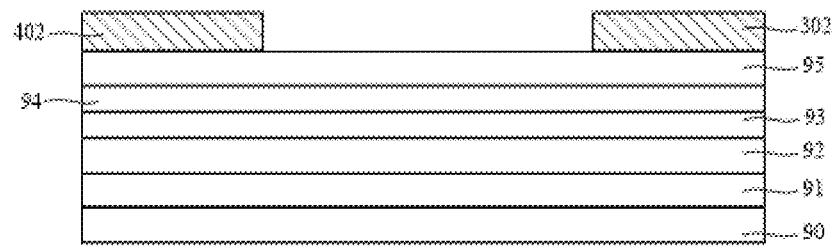
FIG. 8 is a sectional view of A2 along B1B2 in FIG. 7.

As shown in FIGS. 7 and 19, in some embodiments of the present disclosure, the display substrate may further include an encapsulation basal layer 21 arranged at the encapsulation adhesive region 20, surrounding the display region, and broken at a side of the display region adjacent to the first inlet portion 302.

In the display substrate according to the embodiments of the present disclosure, through the encapsulation basal layer 21 at the encapsulation adhesive region 20, it is able to effectively reflect the laser through the encapsulation basal layer 21 when the frit glue is sintered with the laser, thereby to accelerate a sintering process in a better manner.

In some embodiments of the present disclosure, the display substrate may further include a first gate metal layer, and the encapsulation basal layer 21 may be arranged at a same layer, and made of a same material, as the first gate metal layer.

When the encapsulation basal layer 21 is arranged at a same layer, and made of a same material, as the first gate metal layer, it is able to form the encapsulation basal layer 21 and the first gate metal layer through a single patterning process, thereby to simplify the manufacture of the display substrate and reduce the manufacture cost.

In addition, the first gate metal layer may be made of a metal material having an excellent light-reflecting effect. When the encapsulation basal layer 21 is arranged at a same layer, and made of a same material, as the first gate metal layer, it is able to accelerate the laser sintering process.

As shown in FIGS. 7, 19, 20 and 23, in some embodiments of the present disclosure, the display substrate may further include a base substrate 90, and a first gate insulation layer 93, a second gate insulation layer 94 and an interlayer insulation layer 95 laminated one on another on the base substrate 90 in a direction away from the base substrate 90. The encapsulation basal layer 21 may be arranged between the first gate insulation layer 93 and the second gate insulation layer 94. A plurality of first via-holes 210 may be formed in the encapsulation basal layer 21, and the display substrate may be further provided with a plurality of groups of first secondary via-holes 220 corresponding to the plurality of first via-holes 210 respectively. Each group of first secondary via-holes 220 may include a plurality of first secondary via-holes 220, and orthogonal projections of the plurality of first secondary via-holes 220 onto the base substrate 90 may be located within an orthogonal projection of a corresponding first via-hole 210 onto the base substrate 90. Each first secondary via-hole 220 may penetrate through the interlayer insulation layer 95, the second gate insulation layer 94 and the first gate insulation layer 93.

For example, each of the first via-holes 210 and the first secondary via-holes 220 may be of a rectangular shape. Each first via-hole 210 may have a size of 40 µm*40 µm, and each first secondary via-hole 220 may have a size of 6 µm*6 µm. In one group of first secondary via-holes 220, the plurality of first secondary via-holes 220 may be arranged in an array form, and a distance between two adjacent first secondary via-holes 220 may be 3.5 µm.

The display substrate may further include a barrier layer 91 and a buffer layer 92 arranged between the base substrate 90 and the first gate insulation layer 93. Before the encapsulation of the display substrate, the buffer layer 92 may be exposed through each first secondary via-hole 220. In this regard, when the frit glue is applied subsequently, it may permeate into the first secondary via-hole 220 and be in contact with the buffer layer 92. After the laser sintering, it is able to firmly adhere the encapsulation cover plate 97 to the display substrate.

Moreover, through the plurality of first via-holes 210 and the plurality of groups of first secondary via-holes 220 in the encapsulation basal layer 21, it is able to increase a roughness level of a surface of the display substrate in contact with a sealant 96, thereby to improve the encapsulation effect of the display substrate.

The present disclosure further provides in some embodiments a display device including the above-mentioned display substrate.

For example, the display device may be a rigid OLED display device.

For example, the display device may include a rigid OLED watch or bracelet, and an encapsulation for a screen thereof.

According to the display substrate in the embodiments of the present disclosure, the first spacing region 51 and the second spacing region 52 may be arranged between the second inlet portion 402 and the first inlet portion 302, the first spacing region 51 may have the first distance d in the first direction, the second spacing region 52 may have the second distance b in the first direction, the first spacing region 51 may overlap the encapsulation adhesive region 20 at the first overlapping region, the second spacing region 52 may not overlap the encapsulation adhesive region 20, and the first distance d may be greater than the second distance b. In this way, it is able to increase a distance between the second inlet portion 402 and the first inlet portion 302 at the first overlapping region in a better manner, and reduce flatness of a surface of the display substrate away from a base substrate at the first overlapping region, thereby to increase an adhesion area and an adhesion strength between the fit glue and the display substrate, ensure an effective adhesion width of the frit glue at the first overlapping region, improve an encapsulation effect, and prevent the occurrence of an encapsulation failure. Hence, according to the display substrate in the embodiments of the present disclosure, it is able to effective prevent the moisture and oxygen from entering the display device in the vicinity of the first overlapping region without any additional film layer or any improvement in an existing frit encapsulation process, thereby to reduce a risk of electrochemical corrosion for the display device.

When the display device in the embodiments of the present disclosure includes the above-mentioned display substrate, it may also have the above-mentioned beneficial effects, which will not be particularly defined herein.

It should be appreciated that, the display device may be any product or member having a display function, e.g., television, display, digital photo frame, mobile phone or tablet computer.

In some embodiments of the present disclosure, the display device may further include an encapsulation cover plate 97 arranged opposite to the display substrate, and the encapsulation cover plate 97 and the display substrate may be sealed through a sealant 96 at the encapsulation adhesive region 20.

The present disclosure further provides in some embodiments a method for manufacturing the above-mentioned display substrate. The display substrate includes a display region and a non-display region surrounding the display region, and the non-display region includes an encapsulation adhesive region 20. The method includes forming a first power source line 30 and a second power source line 40 at the non-display region. The first power source line 30 includes a transmission portion 301 and a first inlet portion 302 coupled to the transmission portion 301, the transmission portion 301 is arranged between the display region and the first inlet portion 302 and extends in a first direction, and at least a part of the first inlet portion 302 extends in a second direction orthogonal to the first direction. The second power source line 40 includes a peripheral portion 401 and two second inlet portions 402, the peripheral portion 401 surrounds the display region and is provided with an opening, and two ends of the peripheral portion 401 at the opening are coupled to the two second inlet portions 402 respectively. The first inlet portion 302 is arranged between the two second inlet portions 402, a first spacing region 51 and a second spacing region 52 are arranged between each second inlet portion 402 and the first inlet portion 302, the first spacing region 51 has a first distance d in the first direction, the second spacing region 52 has a second distance b in the first direction, the first spacing region 51 overlaps the encapsulation adhesive region 20 at a first overlapping region, the second spacing region 52 does not overlap the encapsulation adhesive region 20, and the first distance d is greater than the second distance b.

According to the display substrate manufactured using the method in the embodiments of the present disclosure, the first spacing region 51 and the second spacing region 52 may be arranged between the second inlet portion 402 and the first inlet portion 302, the first spacing region 51 may have the first distance d in the first direction, the second spacing region 52 may have the second distance b in the first direction, the first spacing region 51 may overlap the encapsulation adhesive region 20 at the first overlapping region, the second spacing region 52 may not overlap the encapsulation adhesive region 20, and the first distance d may be greater than the second distance b. In this way, it is able to increase a distance between the second inlet portion 402 and the first inlet portion 302 at the first overlapping region in a better manner, and reduce flatness of a surface of the display substrate away from a base substrate at the first overlapping region, thereby to increase an adhesion area and an adhesion strength between the frit glue and the display substrate, ensure an effective adhesion width of the frit glue at the first overlapping region, improve an encapsulation effect, and prevent the occurrence of an encapsulation failure. Hence, according to the display substrate in the embodiments of the present disclosure, it is able to effective prevent the moisture and oxygen from entering the display device in the vicinity of the first overlapping region without any additional film layer or any improvement in an existing frit encapsulation process, thereby to reduce a risk of electrochemical corrosion for the display device.

As shown in FIGS. 17, 18, 19 and 20, the present disclosure provides in some embodiments a display substrate, which includes a display region 10 and a non-display region surrounding the display region 10. The non-display region includes an encapsulation adhesive region 20 surrounding the display region. The encapsulation adhesive region 20 includes a corner encapsulation adhesive region 201, an inlet encapsulation adhesive region 202 and a first encapsulation adhesive region 203 arranged at a first side of the display region 10. The first encapsulation adhesive region 201 is arranged between the corner encapsulation adhesive region 201 and the inlet encapsulation adhesive region 202, and an encapsulation basal layer 21 is arranged at the corner encapsulation adhesive region 201. A second power source line 40, a gate driving circuitry GOA and a plurality of first signal lines 70 for providing signals to the gate driving circuitry GOA are arranged at the non-display region.

The second power source line 40 includes a power source corner portion 4011, and a first power source portion 4012 overlapping the first encapsulation adhesive region 203 and extending in a first direction.

A target portion 701 of each first signal line 70 is at least located at the corner encapsulation adhesive region 201 and extends in a second direction orthogonal to the first direction. An orthogonal projection of the target portion 701 onto a base substrate of the display substrate may be located between an orthogonal projection of the encapsulation basal layer 21 onto the base substrate and an orthogonal projection of the first power source portion 4012 onto the base substrate.

To be specific, the display substrate may include the display region 10 and the non-display region. For example, the display region 10 may be of a rectangular shape, and the non-display region may completely surround the entire display region 10.

The non-display region may include the encapsulation adhesive region surrounding the display region, and the encapsulation adhesive region may include two corner encapsulation adhesive regions 201, one inlet encapsulation adhesive region 202 and two first encapsulation adhesive regions 203 which are all arranged at the first side of the display region. The first side may be a side where a lower frame of the display substrate is located. For example, the inlet encapsulation adhesive region 202 may be arranged at a middle position of the lower frame of the display substrate, the two corner encapsulation adhesive regions 201 may be arranged at a lower left corner and a lower right corner of the display substrate respectively, and each first encapsulation adhesive region 203 may be arranged between the inlet encapsulation adhesive region 202 and a corresponding corner encapsulation adhesive region 201.

It should be appreciated that, the encapsulation adhesive region may further include a second encapsulation adhesive region 204 enclosing a second side, a third side and a fourth side of the display region. The second side may be arranged opposite to the first side, and the third side may be arranged opposite to the fourth side. For example, the third side may be a left side of the display region, and the fourth side may be a right side of the display region.

The display substrate may further include an encapsulation basal layer 21, at least a part of the encapsulation basal layer 21 may be arranged at the corner encapsulation adhesive region 201, and the encapsulation basal layer 21 may further include a portion arranged at the second encapsulation adhesive region 204.

The display substrate may further include the second power source line 40. For example, the second power source line 40 may include a negative power source signal line VSS. For example, the second power source line 40 may include two power source corner portions 4011 and two first power source portions 4012. The power source corner portions 4011 may be arranged at the corner encapsulation adhesive regions 201 respectively, and the first power source portions 4012 may be arranged at the first encapsulation adhesive regions 203 respectively. The second power source line 40 may further include a second power source portion 4013 enclosing the second side, the third side and the fourth side of the display region.

Figure 20:
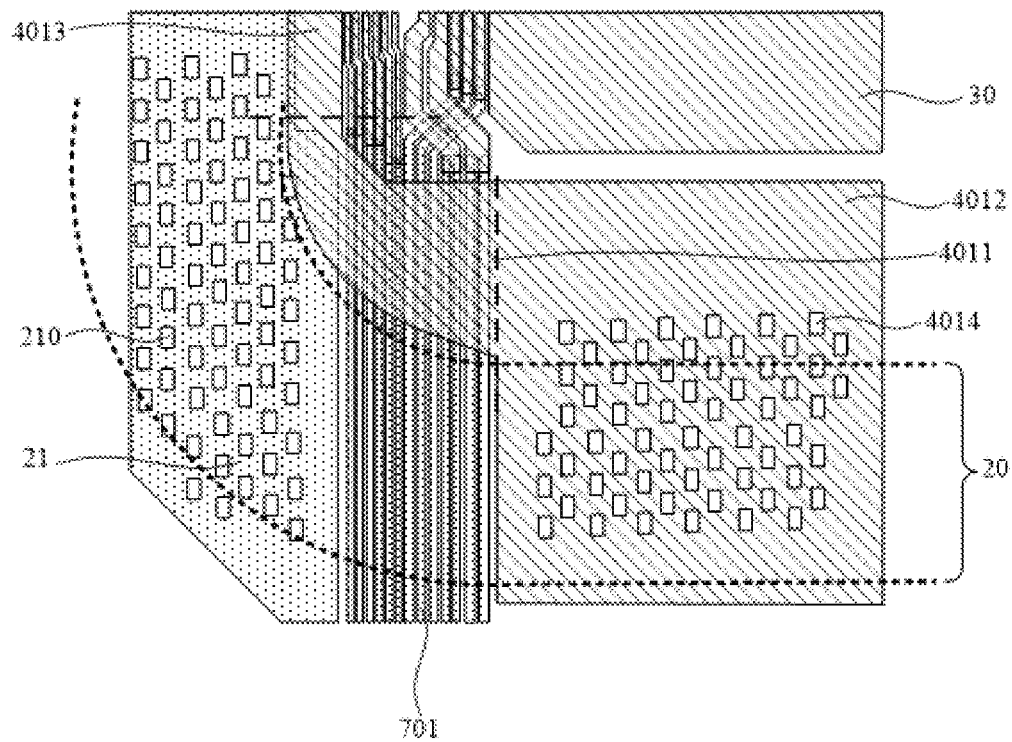
FIG. 20 is an enlarged view of A4 in FIG. 19.
Figure 21:
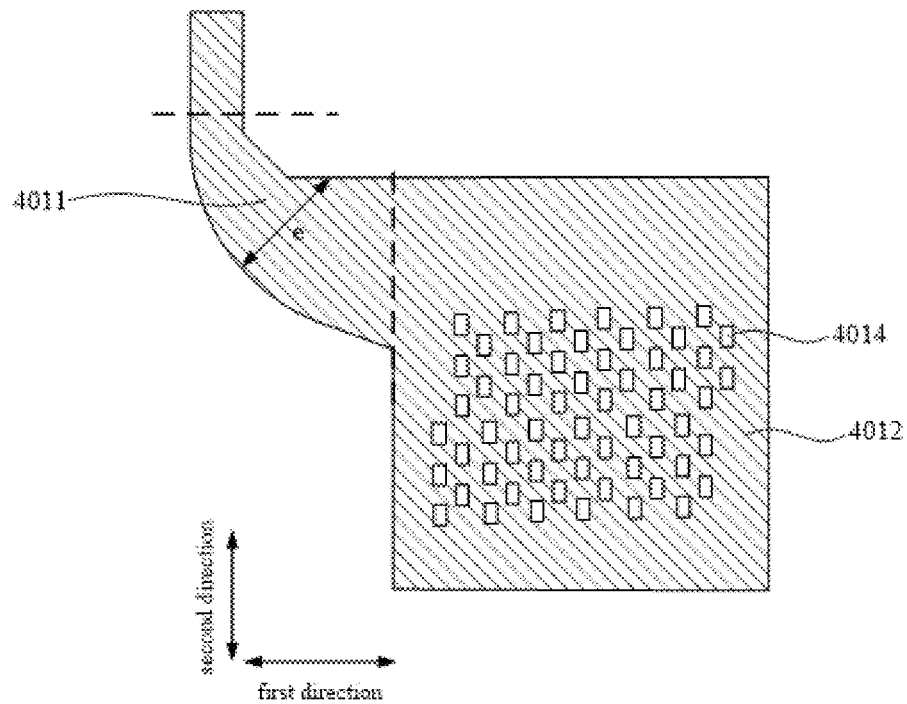
FIG. 21 is a schematic view showing the second power source line in FIG. 20.

For example, each power source corner portion 4011 may overlap the corresponding corner encapsulation adhesive region 201, or as shown in FIGS. 17, 20 and 21, each power source corner portion 4011 may not overlap the corresponding corner encapsulation adhesive region 201.

Figure 18:
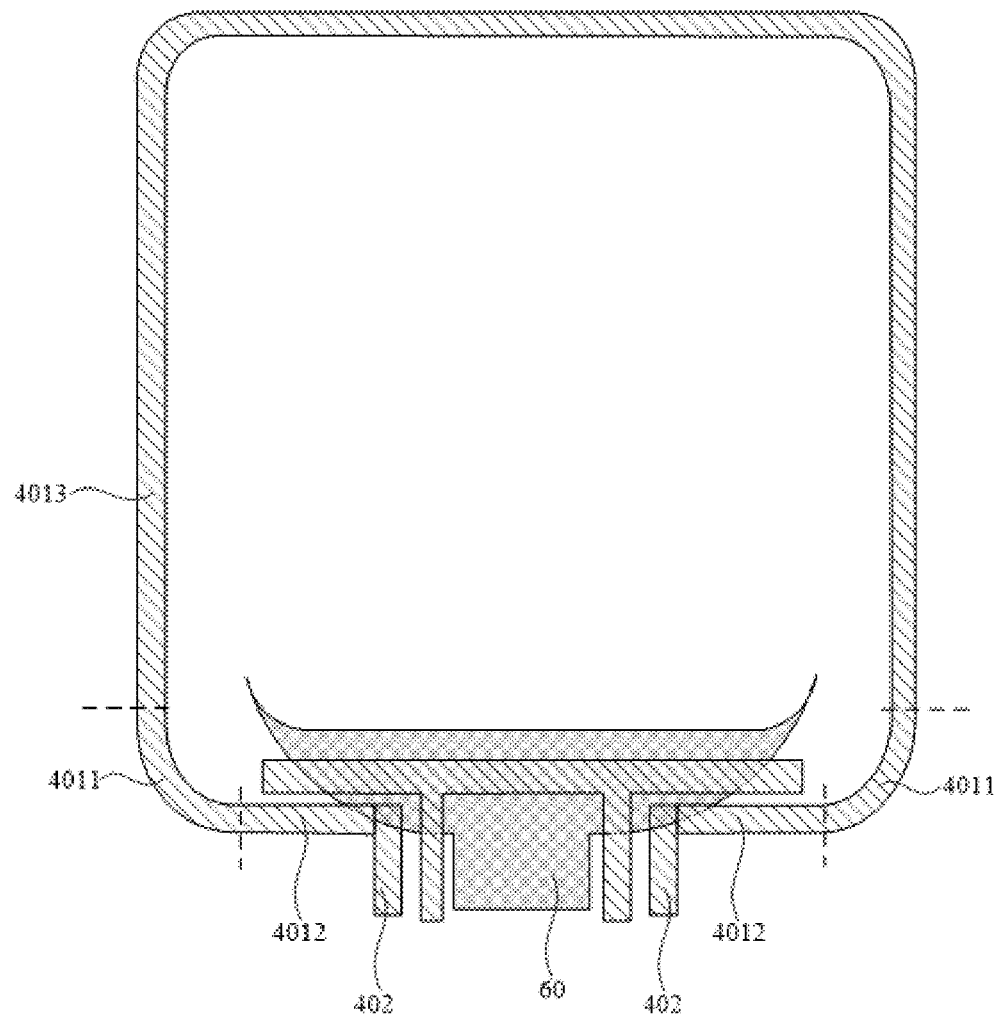
FIG. 18 is a schematic view showing the layout of the first power source line and the second power source line in FIG. 17.

As shown in FIG. 1, for example, the second power source line 40 may include a peripheral portion 401 and two second inlet portions 402. As shown in FIG. 18, the peripheral portion 401 may include two power source corner portions 4011, two first power source portions 4012 and a second power source portion 4013.

The display substrate may further include a gate driving circuitry GOA. For example, the gate driving circuitry GOA may include shift register units corresponding to gate lines in the display substrate respectively and configured to provide scanning signals to the gate lines. The display substrate may further include the plurality of first signal lines 70 configured to provide signals to the gate driving circuitry GOA. The plurality of first signal lines 70 may be of various types. For example, the plurality of first signal lines 70 may include a frame start signal line, a clock signal line, a first level signal line, a second level signal line, etc. The gate driving circuitry GOA may be arranged at a left side and a right side of the display region, and each first signal line 70 may be electrically coupled to the gate driving circuitry GOA and a driving IC in the display substrate.

The target portion 701 of each first signal line 70 may be at least arranged at the corner encapsulation adhesive region 201 and extend in the second direction. For example, the target portions 701 of the plurality of first signal lines 70 may be spaced apart from each other in the first direction.

Based on the specific structure of the display substrate in the embodiments of the present disclosure, when the orthogonal projection of the target portion 701 onto the base substrate is located between the orthogonal projection of the encapsulation basal layer 21 onto the base substrate and the orthogonal projection of the first power source portion 4012 onto the base substrate, the transmission basal layer 21, the target portion 701 of the first signal line 70 and the first power source portion 4012 may together form an encapsulation substrate in contact with a sealant at the corner encapsulation adhesive region 201 and the first encapsulation adhesive region 203. As a result, it is able to increase a contact area between the sealant and the display substrate and improve the adhesion therebetween, thereby to ensure an excellent encapsulation effect.

In addition, according to the display substrate in the embodiments of the present disclosure, when the transmission basal layer 21, the target portion 701 of the first signal line 70 and the first power source portion 4012 together form an encapsulation substrate in contact with a sealant at the corner encapsulation adhesive region 201 and the first encapsulation adhesive region 203, it is able to prevent the formation of a large-size encapsulation basal layer 21 at the corner encapsulation adhesive region 201 and the first encapsulation adhesive region 203, thereby to reduce the manufacture cost of the display substrate.

As shown in FIG. 21, in some embodiments of the present disclosure, a boundary of the power source corner portion 4011 away from the display region may be of an arc-like shape, and the power source corner portion 4011 may have a width e in a curvature radius direction. The width e may gradually decrease in a direction from the first encapsulation adhesive region 203 toward the corner encapsulation adhesive region 201.

To be specific, an orthogonal projection of the power source corner portion 4011 onto the base substrate may partially overlap the orthogonal projections of the plurality of first signal lines 70 onto the base substrate.

When the width e gradually decreases in the direction from the first encapsulation adhesive region 203 toward the corner encapsulation adhesive region 201, an overlapping area between the second power source line 40 and the target portion 701 of the first signal line 70 may gradually decrease at the corner encapsulation adhesive region 201, so it is able to reduce a parasitic capacitance generated between the second power source line 40 and the target portion 701 of the first signal line 70 in a better manner, thereby to improve the signal output stability of the first signal line 70.

In addition, when the target portion 701 of the first signal line 70 is arranged at a same layer, and made of a same material, as a first gate metal layer of the display substrate and the second power source line 40 is arranged at a same layer, and made of a same material, as a first source/drain metal layer of the display substrate, the second power source line 40 may be arranged at a side of the target portion 701 of the first signal line 70 away from the base substrate. When the overlapping area between the second power source line 40 and the target portion 701 of the first signal line 70 gradually decreases at the corner encapsulation adhesive region 201, it is able to reduce an area of the target portion 701 of the first signal line 70 shielded by the second power source line 40 in a better manner. In addition, because light-reflecting performance of the target portion 701 of the first signal line 70 is superior to that of the second power source line 40, through the above arrangement mode, it is able to effectively accelerate a laser sintering operation during the encapsulation.

As shown in FIG. 21, in some embodiments of the present disclosure, a width of the first power source portion 4012 may be greater than a maximum value of the width e in the second direction.

To be specific, the first power source portion 4012 may be reused as the encapsulation substrate and in contact with the sealant, so when the width of the first power source portion 4012 is greater than the maximum value of the width e, it is able to increase a contact area between the first power source portion 4012 and the sealant in a better manner, thereby to improve a laser reflecting effect during the encapsulation and improve the encapsulation efficiency.

In addition, when the width of the first power source portion 4012 is greater than the maximum value of the width e, it is able to increase an overall area of the second power source line 40, thereby to reduce an IR drop across the second power source line 40.

In some embodiments of the present disclosure, the orthogonal projection of the encapsulation basal layer 21 onto the base substrate may at least partially overlap an orthogonal projection of the power source corner portion 4011 onto the base substrate.

Through the above arrangement mode, it is able to further reduce the flatness of the surface of the display substrate away from the base substrate at the corner encapsulation adhesive region 201, thereby to increase adhesion strength between the sealant and the display substrate in a better manner, and improve the encapsulation effect for the display substrate at the corner encapsulation adhesive region 201.

As shown in FIGS. 17, 19 and 20, in some embodiments of the present disclosure, at least a part of the gate driving circuitry GOA may be arranged between the display region and the corner encapsulation adhesive region 201, and the orthogonal projection of the target portion onto the base substrate of the display substrate may at least partially overlap the orthogonal projection of the power source corner portion 4011 onto the base substrate.

To be specific, at least a part of the gate driving circuitry GOA may be arranged between the display region and the corner encapsulation adhesive region 201, one end of each first signal line 70 may be electrically coupled to the gate driving circuitry GOA through the corner encapsulation adhesive region 201, and the other end thereof may be electrically coupled to the driving IC in the display substrate.

The target portion 701 of each first signal line 70 may be arranged at the corner encapsulation adhesive region 201, and the orthogonal projection of the target portion onto the base substrate of the display substrate may at least partially overlap the orthogonal projection of the power source corner portion 4011 onto the base substrate.

As shown in FIG. 19, in some embodiments of the present disclosure, the driving IC may be further arranged at the non-display region. Each first signal line 70 may further include a first non-target portion 702 and a second non-target portion 703, and the first non-target portion 702 may be coupled to the target portion 701 and the second non-target portion 703. The first non-target portion 702 may be arranged at a side of the first power source portion 4012 away from the display region, at least a part of the first non-target portion 702 may extend in the first direction, and the first non-target portion 702 may be arranged at a same layer, and made of a same material, as the first power source portion 4012. The second non-target portion 703 may be coupled to the driving IC, and arranged at a layer different from the first non-target portion 702.

To be specific, each first signal line 70 may include the target portion 701, the first non-target portion 702 and the second non-target portion 703. The target portion 701 may be electrically coupled to the gate driving circuitry GOA, the first non-target portion 702 may be coupled to the target portion 701 and the second non-target portion 703, and the second non-target portion 703 may be coupled to the driving IC.

When the first non-target portion 702 is arranged at a same layer, and made of a same material, as the first power source portion 4012, it is able to form the first non-target portion 702 and the first power source portion 4012 through a single patterning process, thereby to simplify the manufacture of the display substrate and reduce the manufacture cost.

When the second non-target portion 703 is arranged at a layer different from the first non-target portion 702, it is able to prevent the occurrence of a short circuit between the second non-target portion 703 and a functional layer of the display substrate arranged at a same layer, and made of a same material, as the first non-target portion 702 (e.g., the first power source line 30 and the second power source line 40).

In some embodiments of the present disclosure, each of the second non-target portion 703 and the target portion 701 may be arranged at a same layer, and made of a same material, as the encapsulation basal layer 21.

Through the above-mentioned arrangement mode, when the target portion 701 is coupled to the gate driving circuitry GOA, no short circuit may occur between the target portion 701 and the second power source line 40. In addition, the second non-target portion 703 and the target portion may be formed through a single patterning process with the encapsulation basal layer 21, so as to simplify the manufacture of the display substrate and reduce the manufacture cost.

In some embodiments of the present disclosure, the display substrate may further include a first gate metal layer, and the encapsulation basal layer 21 may be arranged at a same layer, and made of a same material, as the first gate metal layer.

When the encapsulation basal layer 21 is arranged at a same layer, and made of a same material, as the first gate metal layer, it is able to form the encapsulation basal layer 21 and the first gate metal layer through a single patterning process, thereby to simplify the manufacture of the display substrate and the reduce the manufacture cost.

In addition, the first gate metal layer may be made of a metal material having an excellent light-reflecting effect. When the encapsulation basal layer 21 is arranged at a same layer, and made of a same material, as the first gate metal layer, it is able to accelerate the laser sintering process.

In some embodiments of the present disclosure, the display substrate may further include a first gate metal layer and a second gate metal layer. A first target portion of each of a part of the first signal lines 70 may be arranged at a same layer, and made of a same material, as the first gate metal layer, and a second target portion of each of the other part of the first signal lines 70 may be arranged at a same layer, and made of a same material, as the second gate metal layer. Orthogonal projections of the first target portions onto the base substrate of the display substrate and orthogonal projections of the second target portions onto the base substrate may be arranged alternately.

When the first target portion is arranged at a same layer, and made of a same material, as the first gate metal layer, it is able to form the first target portion and the first gate metal layer through a single patterning process, thereby to simplify the manufacture of the display substrate and reduce the manufacture cost.

When the second target portion is arranged at a same layer, and made of a same material, as the second gate metal layer, it is able to form the second target portion and the second gate metal layer through a single patterning process, thereby to simplify the manufacture of the display substrate and reduce the manufacture cost.

When the orthogonal projections of the first target portions onto the base substrate of the display substrate and the orthogonal projections of the second target portions onto the base substrate are arranged alternately, it is able to further increase the roughness level of the surface of the display substrate in contact with the sealant at the corner encapsulation adhesive region 201, thereby to effectively improve the encapsulation effect of the display substrate.

As shown in FIG. 17, in some embodiments of the present disclosure, the encapsulation adhesive region may further include a second encapsulation adhesive region 204 enclosing the sides of the display region other than the first side, and the encapsulation basal layer 21 may extend to, and cover, the second encapsulation adhesive region 204.

To be specific, the second encapsulation adhesive region 204 may enclose the second side, the third side and the fourth side of the display substrate. When the encapsulation basal layer 21 extends to, and covers, the second encapsulation adhesive region 204, it is able for the encapsulation basal layer 21 at the second encapsulation adhesive region 204 to effectively reflect laser in the case that the fit glue is sintered with the laser, thereby to accelerate the sintering process in a better manner.

Figure 22:
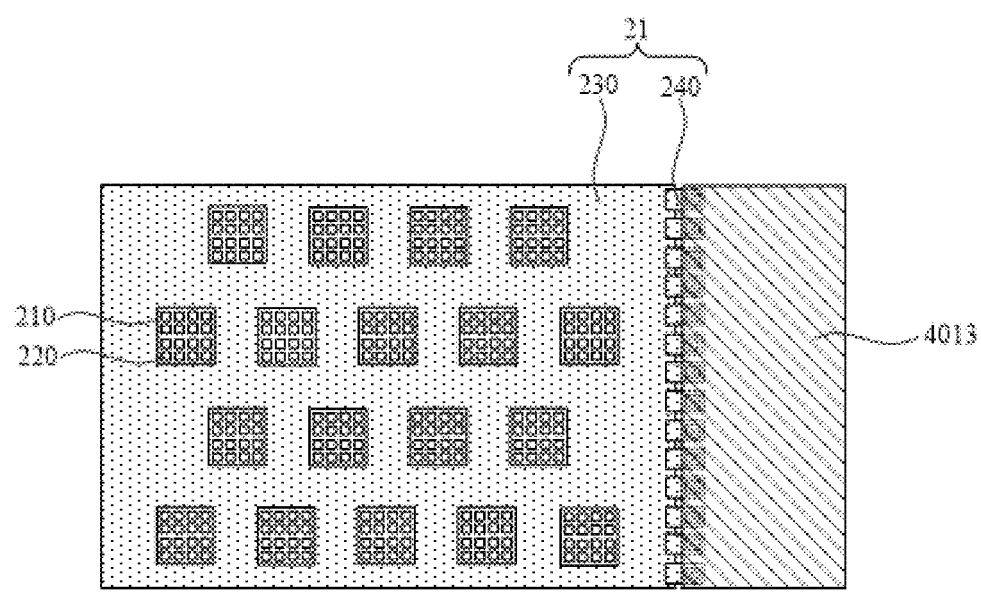
FIG. 22 is a sectional view of the display substrate along D1D2 in FIG. 17.
Figure 23:
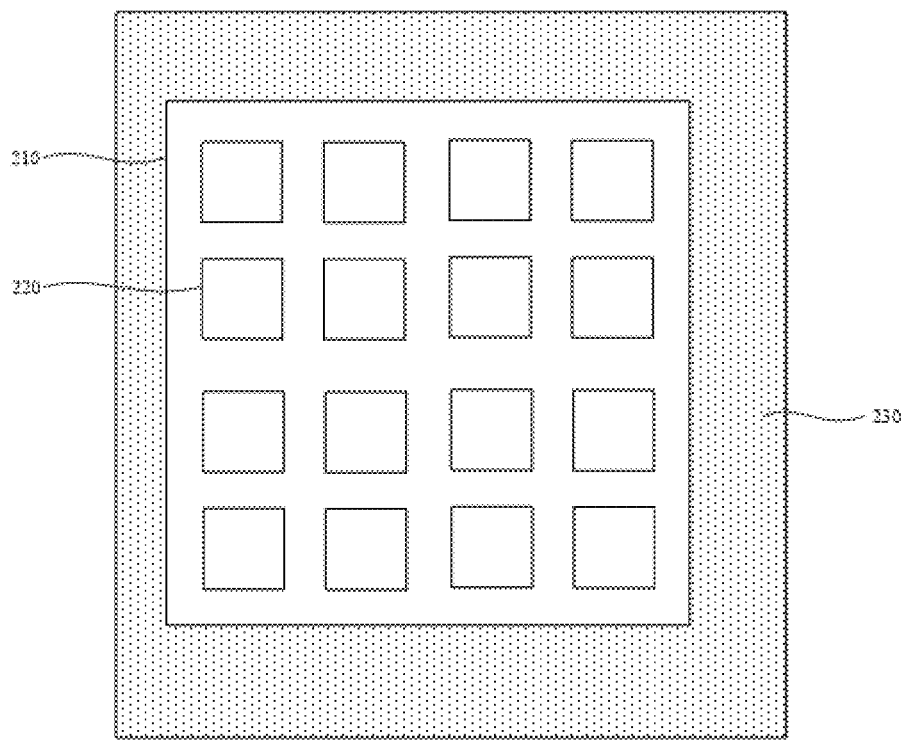
FIG. 23 is a schematic view showing the layout of first via-holes and first secondary via-holes according to one embodiment of the present disclosure.

As shown in FIGS. 17, 22 and 23, in some embodiments of the present disclosure, the display substrate may further include a base substrate, and a first gate insulation layer 93, a second gate insulation layer 94 and an interlayer insulation layer 95 laminated one on another on the base substrate in a direction away from the base substrate. The encapsulation basal layer 21 may be arranged between the first gate insulation layer 93 and the second gate insulation layer 94. A plurality of first via-holes 210 may be formed in the encapsulation basal layer 21, and the display substrate may be further provided with a plurality of groups of first secondary via-holes 220 corresponding to the plurality of first via-holes 210 respectively. Each group of first secondary via-holes 220 may include a plurality of first secondary via-holes 220, and orthogonal projections of the plurality of first secondary via-holes 220 onto the base substrate may be located within an orthogonal projection of a corresponding first via-hole 210 onto the base substrate. Each first secondary via-hole 220 may penetrate through the interlayer insulation layer 95, the second gate insulation layer 94 and the first gate insulation layer 93.

The display substrate may further include a barrier layer 91 and a buffer layer 92 arranged between the base substrate and the first gate insulation layer 93. Before the encapsulation of the display substrate, the buffer layer 92 may be exposed through each first secondary via-hole 220. In this regard, when the frit glue is applied subsequently, it may permeate into the first secondary via-hole 220 and be in contact with the buffer layer 92. After the laser sintering, it is able to firmly adhere the encapsulation cover plate to the display substrate.

Moreover, through the plurality of first via-holes 210 and the plurality of groups of first secondary via-holes 220 in the encapsulation basal layer 21, it is able to increase the roughness level of the surface of the display substrate in contact with the sealant, thereby to improve the encapsulation effect of the display substrate.

As shown in FIG. 22, in some embodiments of the present disclosure, the second power source line 40 may further include a second power source portion 4013 electrically coupled to the power source corner portion 4011 and enclosing the sides of the display region other than the first side. An orthogonal projection of the second power source portion 4013 onto the base substrate may overlap the orthogonal projection of the encapsulation basal layer 21 onto the base substrate, and the second power source portion 4013 may be electrically coupled to the encapsulation basal layer 21 at an overlapping position.

To be specific, the second power source line 40 may further include the second power source portion 4013 enclosing the second side, the third side and the fourth side of the display region, and two ends of the second power source portion 4013 may be electrically coupled to the two power source corner portions 4011 respectively.

For example, at the second side, the third side and the fourth side the orthogonal projection of the second power source portion 4013 onto the base substrate may overlap the orthogonal projection of the encapsulation basal layer 21 onto the base substrate, and the second power source portion 4013 may be electrically coupled to the encapsulation basal layer 21 at an overlapping position at each of the second side, the third side and the fourth side.

When the second power source portion 4013 is electrically coupled to the encapsulation basal layer 21, it is able to apply a voltage signal at a stable potential to the encapsulation basal layer 21, thereby to prevent the encapsulation basal layer 21 to be in a floating state. In addition, it is able to reduce a resistance of the second power source line 40, thereby to effectively reduce an IR drop across the second power source line 40.

As shown in FIG. 22, in some embodiments of the present disclosure, the encapsulation basal layer 21 at the second encapsulation adhesive region 204 may include a body portion 230 and a plurality of conductive connection portions 240. The body portion 230 may enclose the sides of the display region other than the first side. The plurality of conductive connection portions 240 may be electrically coupled to the body portion 230 and spaced apart from each other in an extension direction of the body portion 230. An orthogonal projection of each conductive connection portion onto the base substrate of the display substrate may overlap the orthogonal projection of the second power source portion 4013 onto the base substrate, and the second power source portion 4013 may be electrically coupled to the corresponding conductive connection portion at each overlapping position.

According to the display substrate in the embodiments of the present disclosure, it is able to increase the roughness level of the surface of the display substrate in contact with the sealant at an edge of the second encapsulation adhesive region 204, thereby to improve the encapsulation effect of the display substrate.

In some embodiments of the present disclosure, the body portion 230 and the plurality of conductive connection portions 240 may be formed integrally.

Through the above arrangement mode, it is able to form the body portion 230 and the plurality of conductive connection portions 240 through a single patterning process, thereby to not only ensure the connection performance between the body portion 230 and the plurality of conductive connection portions 240, but also simplify the manufacture of the display substrate and reduce the manufacture cost.

Figure 24:
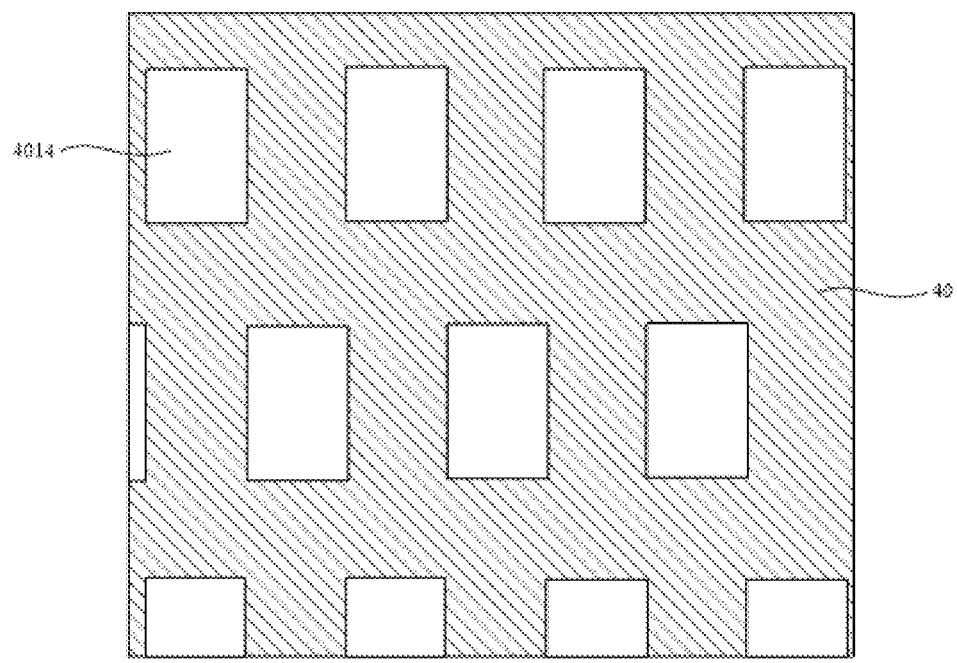
FIG. 24 is a schematic view showing the layout of second via-holes according to one embodiment of the present disclosure.

As shown in FIG. 24, in some embodiments of the present disclosure, the first power source portion 4012 may be provided with a plurality of second via-holes 4014.

For example, the plurality of second via-holes 4014 may be arranged in an array form. Each row of second via-holes 4014 in the second direction may include a plurality of second via-holes 4014 spaced apart from each other in the first direction, and two adjacent rows of second via-holes 4014 may be arranged in a staggered manner in the second direction.

For example, an orthogonal projection of each second via-hole 4014 onto the base substrate may be of a rectangular shape, a size of the second via-hole 4014 in the first direction may be 45 μm, and a size of the second via-hole 4014 in the second direction may be 70 μm.

For example, a distance between two adjacent second via-holes 4014 in the first direction may be 45 μm.

In the display substrate, the first power source portion 4012 may be arranged at a side of the interlayer insulation layer 95 away from the base substrate, and the interlayer insulation layer 95 may be exposed through the plurality of second via-holes 4014 in the first power source portion 4012. In this regard, during the formation of the sealant on the display substrate, the sealant may be in contact with the interlayer insulation layer 95 through the plurality of second via-holes 4014, so after the laser sintering process, it is able to firmly adhere the encapsulation cover plate to the display substrate. In addition, the first power source portion 4012 may be made of a metal material, so it is able to effectively reflect the laser, thereby to accelerate the sintering process in a better manner.

In some embodiments of the present disclosure, a part of the second inlet portion 402 at the inlet encapsulation adhesive region 202 may be provided with a plurality of second via-holes 4014.

As shown in FIGS. 1 and 18, in some embodiments of the present disclosure, a first power source line 30 may be further arranged at the non-display region. The first power source line 30 may include a transmission portion 301 and two first inlet portions 302 coupled to the transmission portion 301.

The transmission portion 301 may be arranged between the display region 10 and the first power source portion 4012, and extend in the first direction. The two first inlet portions 302 may be arranged at a side of the transmission portion 301 away from the display region, and extend in the second direction. At least a part of each first inlet portion 302 may be arranged at the inlet encapsulation adhesive region 202.

For example, the first power source line 30 may include a positive power source signal line VDD.

The first power source line 30 may include the transmission portion 301 and the first inlet portion 302 electrically coupled to each other. The transmission portion 301 may be arranged between the display region and the first inlet portion 302 and extend in the first direction, and at least a part of the first inlet portion 302 may extend in the second direction. For example, the first direction may be a horizontal direction, and the second direction may be a longitudinal direction. For example, the transmission portion 301 may be arranged at the first side of the display substrate and between the display region 10 and the first power source portion 4012, and the first inlet portion 302 may be arranged between the two second inlet portions 402.

For example, the first power source line 30 may include two first inlet portions 302 extending in the second direction and electrically coupled to the transmission portion 301. The two first inlet portions 302 may be spaced apart from each other in the first direction, and arranged between the two second inlet portions 402.

A part of the first inlet portion 302 at the inlet encapsulation adhesive region 202, as an encapsulation substrate, may be in contact with the sealant. Because the first inlet portion 302 is made of a metal material, it is able to effectively reflect the laser, thereby to accelerate the sintering process in a better manner.

As shown in FIG. 19, in some embodiments of the present disclosure, a part of the first inlet portion 302 at the inlet encapsulation adhesive region 202 may be provided with a plurality of third via-holes 3020.

For example, the plurality of third via-holes 3020 may be arranged in an array form. Each row of third via-holes 3020 in the second direction may include a plurality of third via-holes 3020 spaced apart from each other in the first direction, and two adjacent rows of third via-holes 3020 may be arranged in a staggered manner in the second direction.

For example, an orthogonal projection of each third via-hole 3020 onto the base substrate may be of a rectangular shape, a size of each third via-hole 3020 in the first direction may be 45 μm, and a size of each third via-hole 302 in the second direction may be 70 μm.

For example, a distance between two adjacent third via-holes 3020 in the first direction may be 45 μm.

In the display substrate, the first inlet portion 302 may be arranged at a side of the interlayer insulation layer 95 away from the base substrate, and the interlayer insulation layer 95 may be exposed through the plurality of third via-holes 3020 in the first inlet portion 302. In this regard, during the formation of the sealant on the display substrate, the sealant may be in contact with the interlayer insulation layer 95 through the plurality of third via-holes 3020, so after the laser sintering process, it is able to firmly adhere the encapsulation cover plate to the display substrate.

The present disclosure further provides in some embodiments a display device including the above-mentioned display substrate.

According to the display substrate in the embodiments of the present disclosure, when the orthogonal projection of the target portion onto the base substrate is located between the orthogonal projection of the encapsulation basal layer 21 onto the base substrate and the orthogonal projection of the first power source portion 4012 onto the base substrate, the transmission basal layer 21, the target portion of the first signal line 70, the power source corner portion 4011 and the first power source portion 4012 may together form an encapsulation substrate in contact with the sealant at the corner encapsulation adhesive region 201 and the first encapsulation adhesive region 203. As a result, it is able to increase a contact area between the sealant and the display substrate and improve the adhesion therebetween, thereby to ensure an excellent encapsulation effect.

In addition, according to the display substrate in the embodiments of the present disclosure, when the transmission basal layer 21, the target portion of the first signal line 70, the power source corner portion 4011 and the first power source portion 4012 together form the encapsulation substrate in contact with the sealant at the corner encapsulation adhesive region 201 and the first encapsulation adhesive region 203, it is able to prevent the formation of a large-size encapsulation basal layer 21 at the corner encapsulation adhesive region 201 and the first encapsulation adhesive region 203, thereby to reduce the manufacture cost of the display substrate.

Hence, when the display device in the embodiments of the present disclosure includes the display substrate, it may also have the above-mentioned beneficial effects, which will not be particularly defined herein.

It should be appreciated that, the display device may be any product or member having a display function, e.g., television, display, digital photo frame, mobile phone or tablet computer.

In some embodiments of the present disclosure, the display device may further include an encapsulation cover plate arranged opposite to the display substrate, and the encapsulation cover plate and the display substrate may be sealed through a sealant at an encapsulation adhesive region.

The present disclosure further provides in some embodiments a method for manufacturing the above-mentioned display substrate. The display substrate includes a display region and a non-display region surrounding the display region, and the non-display region includes an encapsulation adhesive region surrounding the display region. The encapsulation adhesive region includes a corner encapsulation adhesive region 201, an inlet encapsulation adhesive region 202 and a first encapsulation adhesive region 202 arranged at a first side of the display region, and the first encapsulation adhesive region 202 may be arranged between the corner encapsulation adhesive region 201 and the inlet encapsulation adhesive region 202. The method includes: forming an encapsulation basal layer 21 at the corner encapsulation adhesive region 201; and forming a second power source line 40, a gate driving circuitry GOA and a plurality of first signal lines 70 configured to provide signals to the gate driving circuitry GOA at the non-display region. The second power source line 40 includes a power source corner portion 4011, and a first power source portion 4012 overlapping the first encapsulation adhesive region 203 and extending in a first direction. A target portion of each first signal line 70 is at least arranged at the corner encapsulation adhesive region 201 and extends in a second direction orthogonal to the first direction. An orthogonal projection of the target portion onto a base substrate of the display substrate is located between an orthogonal projection of the encapsulation basal layer 21 onto the base substrate and an orthogonal projection of the first power source portion 4012 onto the base substrate.

According to the display substrate manufactured using the method in the embodiments of the present disclosure, when the orthogonal projection of the target portion onto the base substrate is located between the orthogonal projection of the encapsulation basal layer 21 onto the base substrate and the orthogonal projection of the first power source portion 4012 onto the base substrate, the transmission basal layer 21, the target portion of the first signal line 70 and the first power source portion 4012 may together form an encapsulation substrate in contact with a sealant at the corner encapsulation adhesive region 201 and the first encapsulation adhesive region 203. As a result, it is able to increase a contact area between the sealant and the display substrate and improve the adhesion therebetween, thereby to ensure an excellent encapsulation effect.

In addition, according to the display substrate manufactured using the above-mentioned method, when the transmission basal layer 21, the target portion of the first signal line 70 and the first power source portion 4012 together form an encapsulation substrate in contact with a sealant at the corner encapsulation adhesive region 201 and the first encapsulation adhesive region 203, it is able to prevent the formation of a large-size encapsulation basal layer 21 at the corner encapsulation adhesive region 201 and the first encapsulation adhesive region 203, thereby to reduce the manufacture cost of the display substrate.

It should be appreciated that, the above embodiments have been described in a progressive manner, and the same or similar contents in the embodiments have not been repeated, i.e., each embodiment has merely focused on the difference from the others. Especially, the product embodiments are substantially similar to the method embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising a display region and a non-display region surrounding the display region, wherein the non-display region comprises an encapsulation adhesive region, and a first power source line and a second power source line are arranged at the non-display region;
   the first power source line comprises a transmission portion and a first inlet portion coupled to the transmission portion, the transmission portion is arranged between the display region and the first inlet portion and extends in a first direction, and at least a part of the first inlet portion extends in a second direction orthogonal to the first direction;
   the second power source line comprises a peripheral portion and two second inlet portions, the peripheral portion surrounds the display region and is provided with an opening, and two ends of the peripheral portion at the opening are coupled to the two second inlet portions respectively; and
   the first inlet portion is arranged between the two second inlet portions, a first spacing region and a second spacing region are arranged between each second inlet portion and the first inlet portion, the first spacing region has a first distance in the first direction, the second spacing region has a second distance in the first direction, the first spacing region overlaps the encapsulation adhesive region at a first overlapping region, the second spacing region does not overlap the encapsulation adhesive region, and the first distance is greater than the second distance;
   wherein each second inlet portion comprises a first inlet sub-pattern, a second inlet sub-pattern and a third inlet sub-pattern electrically coupled to each other in turn, the first inlet sub-pattern is electrically coupled to a corresponding end of the peripheral portion, the first spacing region is arranged between the first inlet sub-pattern and the first inlet portion, the second spacing region is arranged between the second inlet sub-pattern and the first inlet portion, and the second distance gradually increases in a direction close to the first spacing region until the second distance is equal to the first distance.

2. The display substrate according to claim 1, wherein the non-display region further comprises a fanout region, a plurality of fanout lines is arranged at the fanout region, and the first overlapping region at least partially overlaps the fanout region.

3. The display substrate according to claim 2, wherein an orthogonal projection of the first overlapping region onto a base substrate of the display substrate is located within an orthogonal projection of the fanout region onto the base substrate.

4. The display substrate according to claim 3, wherein the plurality of fanout lines comprises a plurality of target fanout lines, a first portion of each target fanout line is located at the encapsulation adhesive region, an orthogonal projection of the first portion onto the base substrate overlaps an orthogonal projection of the first power source line onto the base substrate and/or an orthogonal projection of the second power source line onto the base substrate, and a distance between orthogonal projections of the first portions of two adjacent target fanout lines onto the base substrate is greater than 1 μm.

5. The display substrate according to claim 3, wherein the plurality of fanout lines comprises a plurality of target fanout lines, a first portion of each target fanout line is located at the encapsulation adhesive region, an orthogonal projection of the first portion onto the base substrate overlaps an orthogonal projection of the first power source line onto the base substrate and/or an orthogonal projection of the second power source line onto the base substrate, and a distance a between orthogonal projections of the first portions of two adjacent target fanout lines onto the base substrate satisfies a=(0.264~0.5)*k, where k represents a line width of the target fanout line.

6. The display substrate according to claim 1, wherein the third inlet sub-pattern extends in the second direction, and a third distance between the third inlet sub-pattern and the first inlet portion in the first direction is equal to a minimum value of the second distance.

7. The display substrate according to claim 1, wherein a third spacing region is arranged between the third inlet sub-pattern and the first inlet portion, the display substrate further comprises a gate driving circuitry and a plurality of first signal lines configured to provide signals to the gate driving circuitry, and at least a part of each first signal line is arranged at the second spacing region and/or the third spacing region.

8. The display substrate according to claim 1, further comprising a plurality of dummy signal lines, wherein at least a part of each dummy signal line is arranged at the first overlapping region.

9. The display substrate according to claim 8, further comprising a first gate metal layer, wherein each dummy signal line is arranged at a same layer, and made of a same material, as the first gate metal layer.

10. The display substrate according to claim 8, further comprising a second gate metal layer, wherein each dummy signal line is arranged at a same layer, and made of a same material, as the second gate metal layer.

11. The display substrate according to claim 8, further comprising: a first gate metal layer and a second gate metal layer, wherein the plurality of dummy signal lines comprises a plurality of first dummy signal lines and a plurality of second dummy signal lines, orthogonal projections of the first dummy signal lines onto a base substrate of the display substrate and orthogonal projections of the second dummy signal lines onto the base substrate are arranged alternately, each first dummy signal line is arranged at a same layer, and made of a same material, as the first gate metal layer, and each second dummy signal line is arranged at a same layer, and made of a same material, as the second gate metal layer.

12. The display substrate according to claim 8, wherein each dummy signal line extends in the first direction or the second direction.

13. The display substrate according to claim 8, wherein the first overlapping region is covered by the dummy signal lines.

14. The display substrate according to claim 1, further comprising: an encapsulation basal layer arranged at the encapsulation adhesive region, surrounding the display region, and broken at a side of the display region adjacent to the first inlet portion.

15. The display substrate according to claim 14, further comprising: a first gate metal layer, wherein the encapsulation basal layer is arranged at a same layer, and made of a same material, as the first gate metal layer.

16. The display substrate according to claim 14, further comprising: a base substrate, and a first gate insulation layer, a second gate insulation layer and an interlayer insulation layer laminated one on another on the base substrate in a direction away from the base substrate, wherein the encapsulation basal layer is arranged between the first gate insulation layer and the second gate insulation layer, a plurality of first via-holes is formed in the encapsulation basal layer, the display substrate is further provided with a plurality of groups of first secondary via-holes corresponding to the plurality of first via-holes respectively, each group of first secondary via-holes comprise a plurality of first secondary via-holes, orthogonal projections of the plurality of first secondary via-holes onto the base substrate are located within an orthogonal projection of a corresponding first via-hole onto the base substrate, and each first secondary via-hole penetrates through the interlayer insulation layer, the second gate insulation layer and the first gate insulation layer.

17. A display device, comprising a display substrate, the display substrate comprising a display region and a non-display region surrounding the display region, wherein the non-display region comprises an encapsulation adhesive region, and a first power source line and a second power source line are arranged at the non-display region;
the first power source line comprises a transmission portion and a first inlet portion coupled to the transmission portion, the transmission portion is arranged between the display region and the first inlet portion and extends in a first direction, and at least a part of the first inlet portion extends in a second direction orthogonal to the first direction;
the second power source line comprises a peripheral portion and two second inlet portions, the peripheral portion surrounds the display region and is provided with an opening, and two ends of the peripheral portion at the opening are coupled to the two second inlet portions respectively; and
the first inlet portion is arranged between the two second inlet portions, a first spacing region and a second spacing region are arranged between each second inlet portion and the first inlet portion, the first spacing region has a first distance in the first direction, the second spacing region has a second distance in the first direction, the first spacing region overlaps the encapsulation adhesive region at a first overlapping region, the second spacing region does not overlap the encapsulation adhesive region, and the first distance is greater than the second distance;
wherein each second inlet portion comprises a first inlet sub-pattern, a second inlet sub-pattern and a third inlet sub-pattern electrically coupled to each other in turn, the first inlet sub-pattern is electrically coupled to a corresponding end of the peripheral portion, the first spacing region is arranged between the first inlet sub-pattern and the first inlet portion, the second spacing region is arranged between the second inlet sub-pattern and the first inlet portion, and the second distance gradually increases in a direction close to the first spacing region until the second distance is equal to the first distance.

18. The display device according to claim 17, further comprising an encapsulation cover plate arranged opposite to the display substrate, wherein the encapsulation cover plate and the display substrate are sealed through a sealant at an encapsulation adhesive region.

19. A method for manufacturing a display substrate, wherein the display substrate comprises a display region and a non-display region surrounding the display region, and the non-display region comprises an encapsulation adhesive region;
- the method comprises forming a first power source line and a second power source line at the non-display region;
- the first power source line comprises a transmission portion and a first inlet portion coupled to the transmission portion, the transmission portion is arranged between the display region and the first inlet portion and extends in a first direction, and at least a part of the first inlet portion extends in a second direction orthogonal to the first direction;
- the second power source line comprises a peripheral portion and two second inlet portions, the peripheral portion surrounds the display region and is provided with an opening, and two ends of the peripheral portion at the opening are coupled to the two second inlet portions respectively; and
- the first inlet portion is arranged between the two second inlet portions, a first spacing region and a second spacing region are arranged between each second inlet portion and the first inlet portion, the first spacing region has a first distance in the first direction, the second spacing region has a second distance in the first direction, the first spacing region overlaps the encapsulation adhesive region at a first overlapping region, the second spacing region does not overlap the encapsulation adhesive region, and the first distance is greater than the second distance;

wherein each second inlet portion comprises a first inlet sub-pattern, a second inlet sub-pattern and a third inlet sub-pattern electrically coupled to each other in turn, the first inlet sub-pattern is electrically coupled to a corresponding end of the peripheral portion, the first spacing region is arranged between the first inlet sub-pattern and the first inlet portion, the second spacing region is arranged between the second inlet sub-pattern and the first inlet portion, and the second distance gradually increases in a direction close to the first spacing region until the second distance is equal to the first distance.

* * * * *